(12) United States Patent
Zeidler et al.

(10) Patent No.: US 11,164,715 B2
(45) Date of Patent: Nov. 2, 2021

(54) CHARGED PARTICLE BEAM SYSTEM

(71) Applicant: Carl Zeiss MultiSEM GmbH, Oberkochen (DE)

(72) Inventors: Dirk Zeidler, Oberkochen (DE); Stefan Schubert, Oberkochen (DE); Ingo Mueller, Aalen (DE); Joerg Jacobi, Herbrechtingen (DE); Mario Muetzel, Oberkochen (DE); Antonio Casares, Aalen (DE); Christof Riedesel, Aalen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 0 days.

(21) Appl. No.: 17/021,724

(22) Filed: Sep. 15, 2020

(65) Prior Publication Data
US 2020/0411274 A1  Dec. 31, 2020

Related U.S. Application Data

(63) Continuation of application No. 16/416,447, filed on May 20, 2019, now Pat. No. 10,811,215.
(Continued)

(51) Int. Cl.
*H01J 37/14* (2006.01)
*H01J 37/05* (2006.01)
(Continued)

(52) U.S. Cl.
CPC ............. *H01J 37/14* (2013.01); *H01J 37/05* (2013.01); *H01J 37/06* (2013.01);
(Continued)

(58) Field of Classification Search
CPC .. H01J 37/14; H01J 37/05; H01J 37/06; H01J 37/1472; H01J 37/21; H01J 37/244; H01J 37/28; H01J 2237/057; H01J 2237/2801
See application file for complete search history.

(56) References Cited

U.S. PATENT DOCUMENTS

| 4,130,761 A | 12/1978 | Matsuda |
| 4,153,843 A | 5/1979 | Pease |

(Continued)

FOREIGN PATENT DOCUMENTS

| GB | 2519511 A | 4/2015 |
| GB | 2521819 A | 7/2015 |

(Continued)

*Primary Examiner* — Nicole M Ippolito
*Assistant Examiner* — Hanway Chang
(74) *Attorney, Agent, or Firm* — Fish & Richardson P.C.

(57) ABSTRACT

A charged particle beam system includes a charged particle source that generates a first charged particle beam and a multi beam generator that generates a plurality of charged particle beamlets from an incoming first charged particle beam. Each individual beamlet is spatially separated from other beamlets. The charged particle beam system also includes an objective lens that focuses incoming charged particle beamlets in a first plane so that a first region in which a first individual beamlet impinges in the first plane is spatially separated from a second region in which a second individual beamlet impinges in the first plane. The charged particle beam system also includes a projection system and a detector system including a plurality of individual detectors. The projection system images interaction products leaving the first region within the first plane due to impinging charged particles onto a first detector and images interaction products leaving the second region in the first plane onto a second detector.

23 Claims, 14 Drawing Sheets

Related U.S. Application Data

(60) Provisional application No. 62/674,123, filed on May 21, 2018.

(51) Int. Cl.
   *H01J 37/147*     (2006.01)
   *H01J 37/21*      (2006.01)
   *H01J 37/244*     (2006.01)
   *H01J 37/28*      (2006.01)
   *H01J 37/06*      (2006.01)

(52) U.S. Cl.
   CPC .......... *H01J 37/1472* (2013.01); *H01J 37/21* (2013.01); *H01J 37/244* (2013.01); *H01J 37/28* (2013.01); *H01J 2237/057* (2013.01); *H01J 2237/2801* (2013.01)

(56) References Cited

U.S. PATENT DOCUMENTS

| | | |
|---|---|---|
| 4,200,794 A | 4/1980 | Newberry |
| 4,338,548 A | 7/1982 | Bono |
| 4,742,234 A | 5/1988 | Feldman |
| 5,215,623 A | 6/1993 | Takahashi |
| 5,864,142 A | 1/1999 | Muraki |
| 5,892,224 A | 4/1999 | Nakasuji |
| 5,905,267 A | 5/1999 | Muraki |
| 5,981,954 A | 11/1999 | Muraki |
| 6,107,636 A | 8/2000 | Muraki |
| 6,124,599 A | 9/2000 | Muraki |
| 6,137,113 A | 10/2000 | Muraki |
| 6,323,499 B1 | 11/2001 | Muraki |
| 6,333,508 B1 | 12/2001 | Katsap |
| 6,617,595 B1 | 9/2003 | Okunuki |
| 6,633,366 B2 | 10/2003 | De Jager |
| 6,696,371 B2 | 2/2004 | Butschke |
| 6,787,780 B2 | 9/2004 | Hamaguchi |
| 6,804,288 B2 | 10/2004 | Haraguchi |
| 6,818,911 B2 | 11/2004 | Tamamori |
| 6,835,508 B2 | 12/2004 | Butschke |
| 6,872,950 B2 | 3/2005 | Shimada |
| 6,903,345 B2 | 6/2005 | Ono |
| 6,903,353 B2 | 6/2005 | Muraki |
| 6,917,045 B2 | 7/2005 | Hashimoto |
| 6,919,574 B2 | 7/2005 | Hashimoto |
| 6,943,349 B2 | 9/2005 | Adamec |
| 6,953,938 B2 | 10/2005 | Iwasaki |
| 6,992,290 B2 | 1/2006 | Watanabe |
| 7,005,658 B2 | 2/2006 | Muraki |
| 7,015,467 B2 | 3/2006 | Maldonado |
| 7,060,984 B2 | 6/2006 | Nagae |
| 7,084,411 B2 | 8/2006 | Lammer-Pachlinger |
| 7,091,504 B2 | 8/2006 | Wieland |
| 7,109,494 B2 | 9/2006 | Ono |
| 7,126,141 B2 | 10/2006 | Ono |
| 7,129,502 B2 | 10/2006 | Kruit |
| 7,244,949 B2 | 7/2007 | Knippelmeyer |
| 7,285,779 B2 | 10/2007 | Litman |
| 7,375,326 B2 | 5/2008 | Sender |
| 7,420,164 B2 | 9/2008 | Nakasuji |
| 7,468,507 B2 | 12/2008 | Rogers |
| 7,504,622 B2 | 3/2009 | Elyasaf |
| 7,535,001 B2 | 5/2009 | Sender |
| 7,601,972 B2 | 10/2009 | Nakasuji |
| 7,619,203 B2 | 11/2009 | Elyasaf |
| 7,696,497 B2 | 4/2010 | Rogers |
| 8,035,082 B2 | 10/2011 | Yamazaki |
| 8,134,135 B2 | 3/2012 | Kruit |
| 8,350,214 B2 | 1/2013 | Otaki |
| 8,362,425 B2 | 1/2013 | Han |
| 8,384,051 B2 | 2/2013 | Ozawa |
| 8,598,525 B2 | 12/2013 | Zeidler |
| 8,618,496 B2 | 12/2013 | Wieland |
| 8,704,192 B2 | 4/2014 | Sano |
| 8,748,842 B2 | 6/2014 | Ohashi |
| 8,779,399 B2 | 7/2014 | Yamanaka |
| 8,829,465 B2 | 9/2014 | Tsunoda |
| 8,963,099 B2 | 2/2015 | Yamada |
| 9,153,413 B2 | 10/2015 | Almogy |
| 9,263,233 B2 | 2/2016 | Zeidler |
| 9,336,981 B2 | 5/2016 | Knippelmeyer |
| 9,336,982 B2 | 5/2016 | Zeidler |
| 9,349,571 B2 | 5/2016 | Kemen |
| 9,368,314 B2 | 6/2016 | Nakasuji |
| 9,530,613 B2 | 12/2016 | Rogers |
| 9,536,702 B2 | 1/2017 | Lang |
| 9,607,805 B2 | 3/2017 | Liu |
| 9,653,254 B2 | 5/2017 | Zeidler |
| 9,702,983 B2 | 7/2017 | Eder |
| 9,922,799 B2 | 3/2018 | Li |
| 9,991,089 B2 | 6/2018 | Mueller |
| 10,062,541 B2 | 8/2018 | Ren |
| 10,141,160 B2 | 11/2018 | Ren |
| 10,354,831 B2 | 7/2019 | Kemen |
| 10,388,487 B2 | 8/2019 | Zeidler |
| 10,535,494 B2 | 1/2020 | Zeidler |
| 10,541,112 B2 | 1/2020 | Schubert |
| 10,586,677 B1 | 3/2020 | Okada |
| 10,600,613 B2 | 3/2020 | Zeidler |
| 10,622,184 B2 | 4/2020 | Knippelmeyer |
| 10,643,820 B2 | 5/2020 | Ren |
| 10,741,355 B1 | 8/2020 | Zeidler |
| 10,811,215 B2 | 10/2020 | Zeidler |
| 10,854,423 B2 | 12/2020 | Barov |
| 10,879,031 B2 | 12/2020 | Ren |
| 10,896,800 B2 | 1/2021 | Riedesel |
| 2009/0014649 A1 | 1/2009 | Nakasuji |
| 2014/0197325 A1 | 7/2014 | Kato |
| 2015/0357157 A1 | 12/2015 | Mueller et al. |
| 2017/0133198 A1 | 5/2017 | Kruit |
| 2019/0333732 A1 | 10/2019 | Ren |
| 2019/0355545 A1 | 11/2019 | Zeider et al. |
| 2020/0211810 A1 | 7/2020 | Zeidler |
| 2020/0243300 A1 | 7/2020 | Zeidler |
| 2020/0373116 A1 | 11/2020 | Zeidler |
| 2021/0005423 A1 | 1/2021 | Zeidler |
| 2021/0035773 A1 | 2/2021 | Zeidler |

FOREIGN PATENT DOCUMENTS

| | | |
|---|---|---|
| JP | 59184524 A | 10/1984 |
| JP | 60042825 A | 3/1985 |
| JP | 60105229 A | 6/1985 |
| JP | 61263217 A | 11/1986 |
| JP | 2014229481 A | 12/2014 |
| WO | WO 2005/024881 A2 | 3/2005 |
| WO | WO 2007/028596 A1 | 3/2007 |
| WO | WO2013032949 A1 | 3/2013 |
| WO | WO 2016/124648 | 8/2016 |
| WO | WO2020057678 A1 | 3/2020 |
| WO | WO2020064035 A1 | 4/2020 |
| WO | WO2020065094 A1 | 4/2020 |
| WO | WO2020070074 A1 | 4/2020 |
| WO | WO2020151904 A2 | 7/2020 |
| WO | WO2020249147 A1 | 12/2020 |

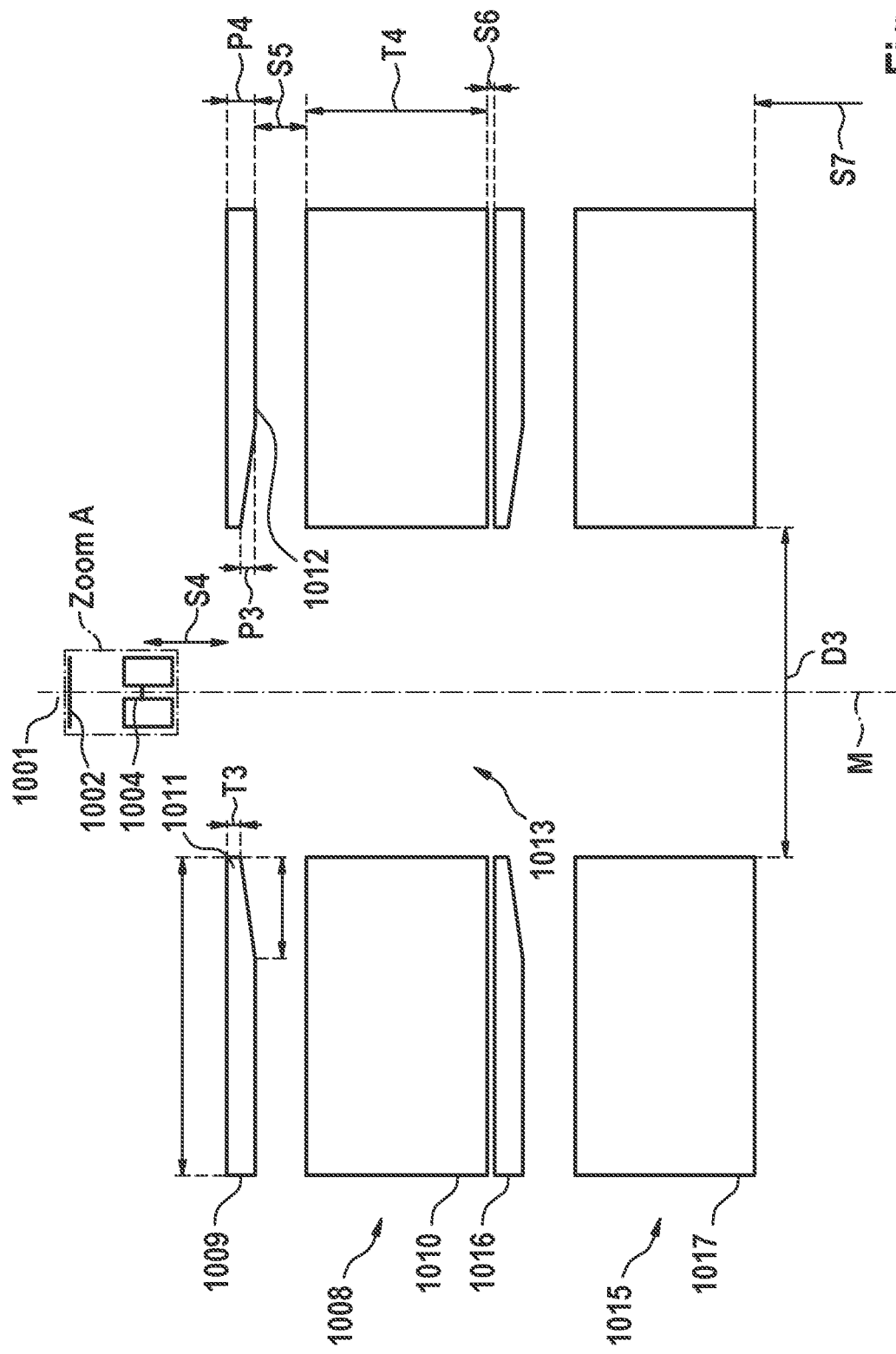

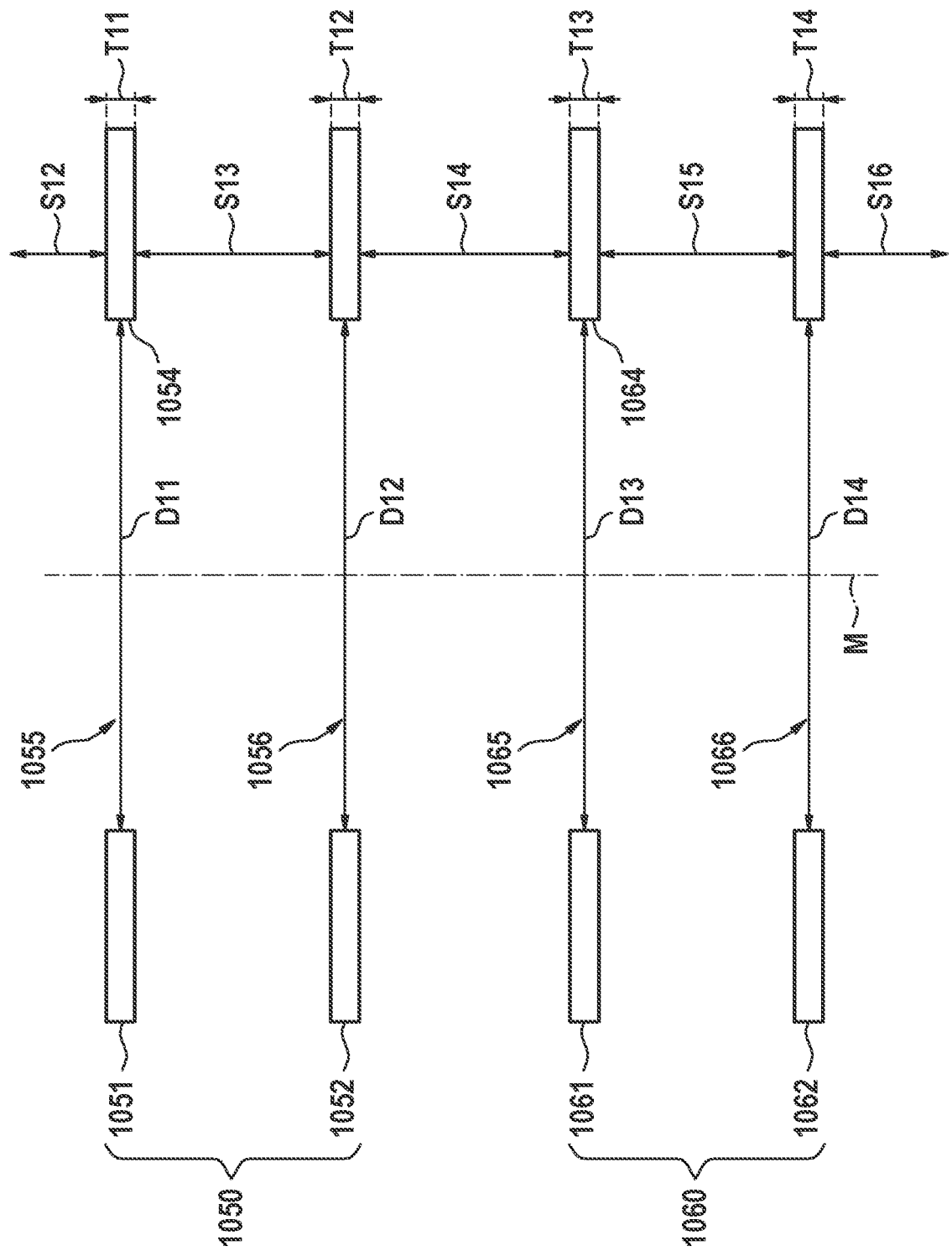

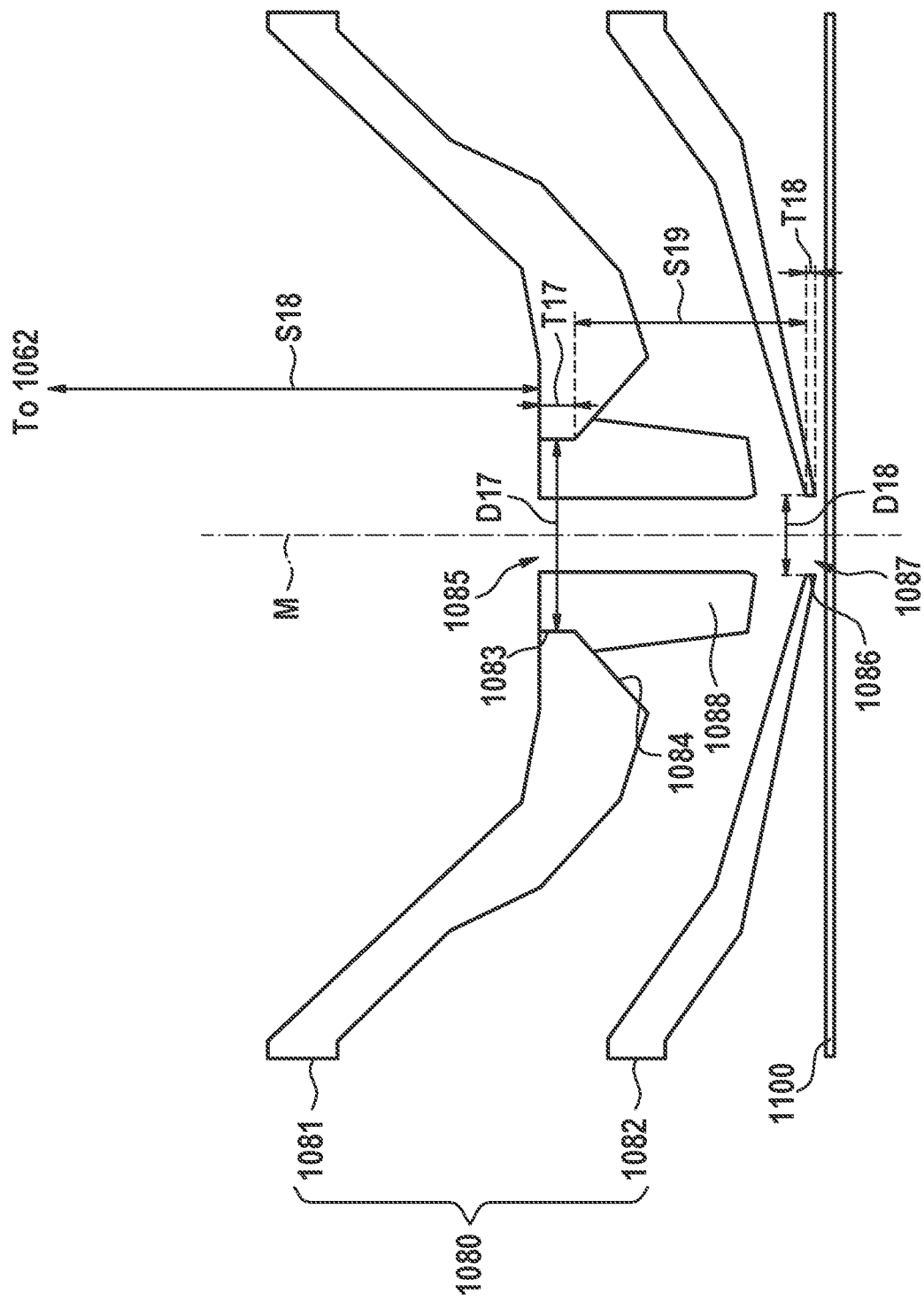

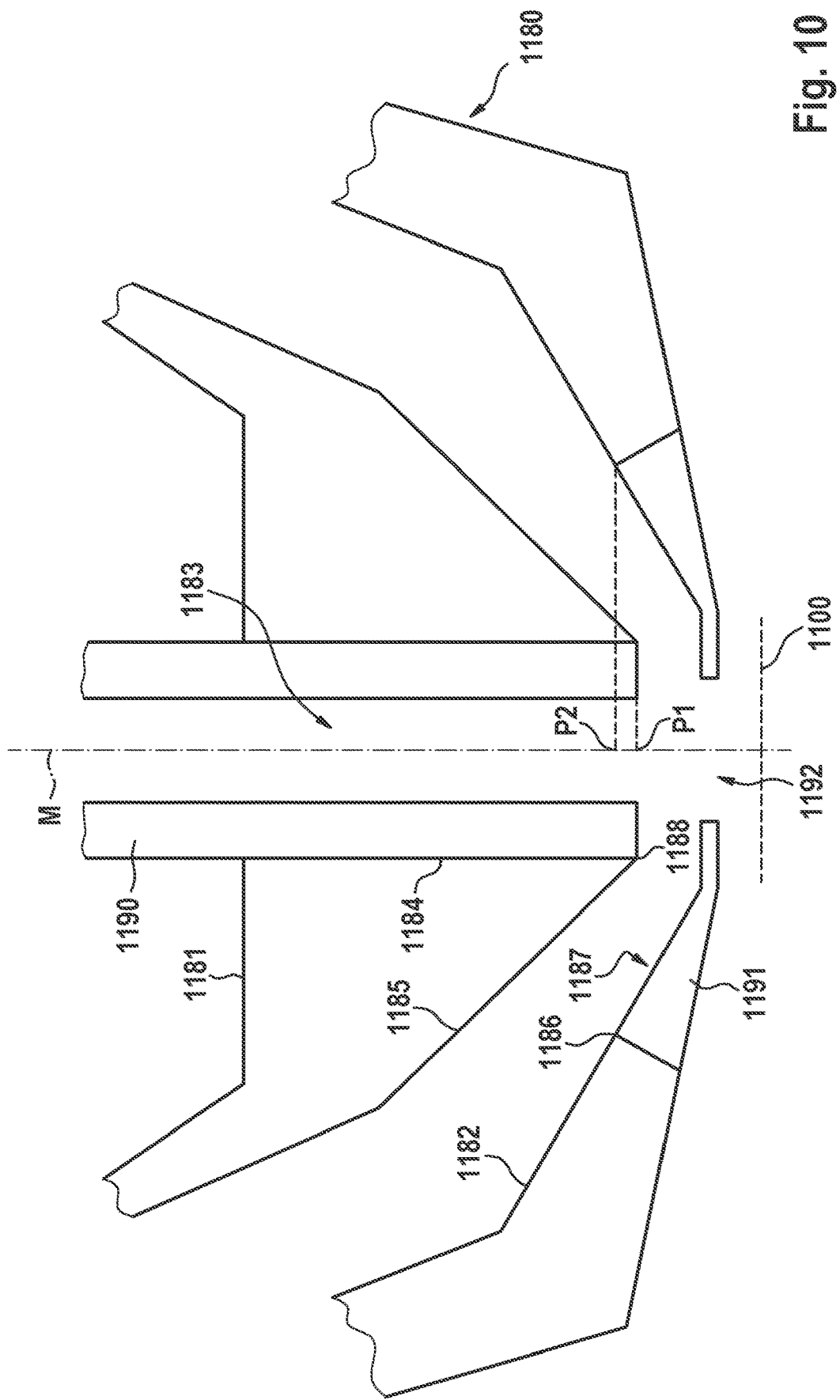

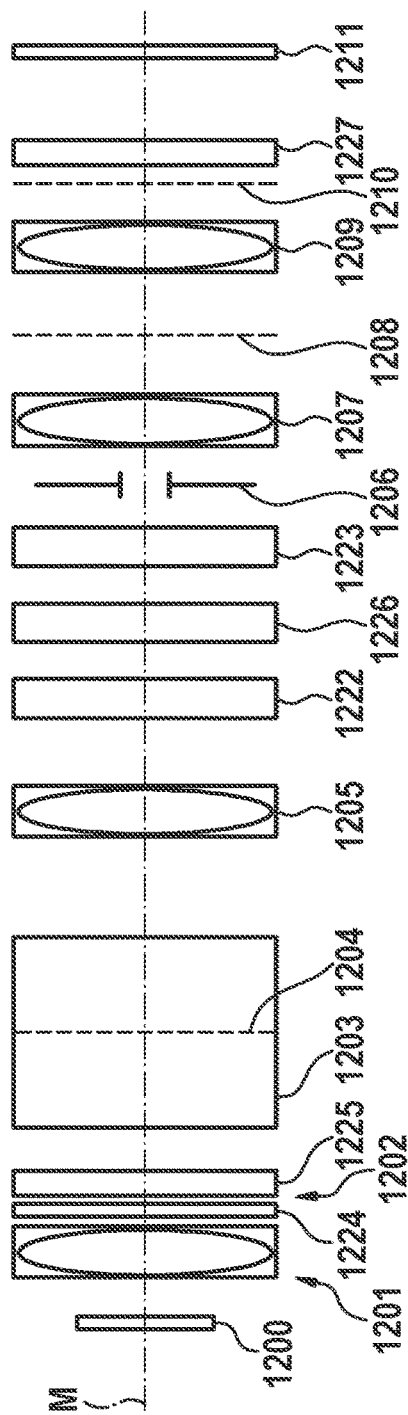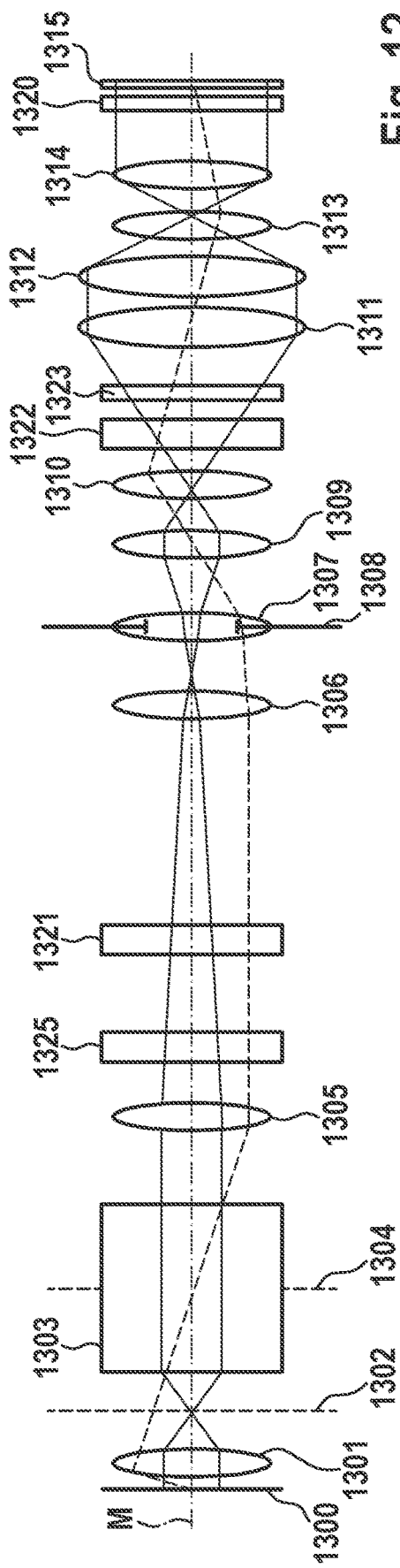

CHARGED PARTICLE BEAM SYSTEM

CROSS-REFERENCE TO RELATED APPLICATION

This application is a continuation of, and claims benefit under 37 U.S.C. 120, to U.S. application Ser. No. 16/416,447, filed May 20, 2019, which claims priority under 35 U.S.C. § 119(e)(1) to U.S. Provisional Application No. 62/674,123 filed May 21, 2018. The contents of these applications are hereby incorporated by reference in its entirety.

FIELD

The present disclosure relates to charged particle beam systems. More particularly, the present disclosure relates to a multi beam charged particle beam system and related methods.

BACKGROUND

A multi beam charged particle beam system is disclosed, for example, in WO2005024881A2 and in WO2016/124648.

SUMMARY

The present disclosure seeks to provide a multi beam charged particle beam system with an improved arrangement of particle optical components to lead the multitude charged particle beamlets from the multi beam generator to the objective lens. The disclosure also seeks to provide a multi beam charged particle beam system with an improved arrangement of a projection and detection system for secondary charged particle beamlets of interaction products released from a sample due to an impinging multitude of primary charged particle beamlets.

According to a first aspect, the charged particle beam system can include a charged particle source configured to generate a first charged particle beam and a multi beam generator configured to generate a plurality of charged particle beamlets from an incoming first charged particle beam. Each individual beamlet of the plurality of charged particle beamlets thereby is spatially separated from other beamlets of the plurality of charged particle beamlets. The charged particle beam system further includes an objective lens configured to focus incoming charged particle beamlets in a first plane in a manner that a first region in which a first individual beamlet of the plurality of charged particle beamlets impinges in the first plane is spatially separated from a second region in which a second individual beamlet of the plurality of charged particle beamlets impinges in the first plane. Further the charged particle beam system includes a projection system and a detector system including a plurality of individual detectors, wherein the projection system is configured to image interaction products leaving the first region within the first plane due to impinging charged particles onto a first one of the plurality of individual detectors and to image interaction products leaving the second region in the first plane due to impinging charged particles onto a second one of the plurality of individual detectors.

The term plurality of individual detectors in this specification means a detection arrangement having a plurality of sensing areas each of which is capable to generate a signal due to impinging secondary charged particles which is to a large extent independent from the signals generated by the other sensing areas. For each primary charged particle beamlet one or more individual detectors or sensing areas can be provided. However, it is also possible that for a particular small number of primary charged particle beamlets no detector or sensing area is provided if for such primary beamlets no detection signal is to be generated. Each individual detector can be formed by one or more sensitive areas of a CCD detector or direct electron detector. In embodiments described hereinafter in more detail, the individual detectors are formed by a scintillator plate with a plurality of light detectors, each light detector being optically allocated to particular partial area of the scintillator plate.

In an embodiment the projection system includes a combination of an energy filter and a lens configured to adjust a telecentricity of the charged particle beamlets formed by the interaction products when entering the energy filter.

In an embodiment, the charged particle beam system can include, in addition, a first magnetic field lens, a second magnetic field lens and a third magnetic field lens arranged between the multi beam generator and the objective lens, and wherein each charged particle beamlet passes each of the first, second and third magnetic field lens.

In an embodiment of the charged particle beam system the first magnetic field lens is arranged closest to the multi beam generator of the first, second and third magnetic field lenses, and the first magnetic field lens includes an upper pole piece and a lower pole piece. The upper pole piece can be arranged at a distance in the range from 30 mm to 100 mm from the multi beam generator.

In another embodiment, the upper pole piece of the first magnetic field lens can be arranged at a distance in the range from 50 mm to 80 mm from the multi beam generator.

In another embodiment, the upper pole piece of the first magnetic field lens can be arranged at a distance in the range from 60 mm to 75 mm from the multi beam generator.

In another embodiment, the second magnetic field lens has an upper pole piece and the third magnetic field lens has an upper pole piece, wherein a distance between the upper pole piece of the second magnetic field lens and the upper pole piece of the first magnetic field lens is smaller than a distance between the upper pole piece of the third magnetic field lens and the upper pole piece of the first magnetic field lens. The distance between the upper pole piece of the second magnetic field lens and the upper pole piece of the first magnetic field lens can be in a range between 1.5 times and 3 times the distance between the multi beam generator and the upper pole piece of the first magnetic field lens.

In another embodiment, the distance between the upper pole piece of the second magnetic field lens and the upper pole piece of the first magnetic field lens can be in the range between 1.8 times and 2.5 times the distance between the multi beam generator and the upper pole piece of the first magnetic field lens.

In another embodiment, the distance between the upper pole piece of the second magnetic field lens and the upper pole piece of the third magnetic field lens is in the range between 0.7 times and 1.3 times the distance between the multi beam generator and the upper pole piece of the first magnetic field lens.

In another embodiment, the distance between the upper pole piece of the second magnetic field lens and the upper pole piece of the third magnetic field lens is in the range between 0.9 times and 1.1 times the distance between the multi beam generator and the upper pole piece of the first magnetic field lens.

In another embodiment, a direction of a magnetic field of one of the first, second and third magnetic field lenses is inverse to a direction of a magnetic field of at least one other of the first, second and third magnetic field lenses or the objective lens.

In another embodiment, the charged particle beam system further includes a magnetic beam splitter arranged between the third magnetic pole piece and the objective lens. The beam splitter can be free of dispersion for a single pass of the charged particle beamlets passing the beam splitter from the third magnetic field lens to the objective lens.

In another embodiment, the charged particle beam system can further include a focusing electrode and a ring electrode arranged between the multi beam generator and the first magnetic field lens.

In an embodiment the focusing electrode is arranged closer to the multi beam generator than the ring electrode. The multi beam generator and the ring electrode, in operation, can be biased with an identical electrical potential, and the focusing electrode can be biased with an electrical potential that differs from the electrical potential of the ring electrode.

In an embodiment, the electrical potential of the focusing electrode can be in a range between 20% and 100% more positive or less positive than the electrical potential of the ring electrode relative to the electrical potential of a cathode of the charged particle source.

In an embodiment, the electrical potential of the focusing electrode can be in the range between 30% and 80% more positive or less positive than the electrical potential of the ring electrode relative to the electrical potential of the cathode of the charged particle source.

In an embodiment, the electrical potential of the focusing electrode can be in the range between 50% and 60% more positive or less positive than the electrical potential of the ring electrode relative to the electrical potential of the cathode of the charged particle source.

In an embodiment, the charged particle beam system can further include at least one magnetic condenser lens arranged between the charged particle source and the multi beam generator. The at least one magnetic condenser lens can include an upper pole piece and a lower pole piece and a pole piece boring coaxial to an optical axis through the upper pole piece and the lower pole piece. The pole piece boring has a first diameter, the focusing electrode has an opening for passing the beamlets having a second opening diameter. The first diameter can be in the range between 1.5 times and 5 times the second opening diameter.

In an embodiment, the first diameter is in the range between 2.5 times and 3.5 times the second opening diameter.

In a further embodiment one or more electrostatic or magnetic alignment elements can be provided in the region of the field lenses and can be excited to generate aberration correction fields having a three-fold symmetry around the optical axis of the system. These aberration correction fields can serve to correct for three-fold aberrations generated for example by a beam splitter arranged downstream of the field lens system. The alignments elements can be configured as hexapole elements, or as eight pole elements, excited to generate the correction fields having three-fold symmetry, or even more preferable twelve-pole elements or elements of a symmetry around the optical axis of more than a twelve-pole element.

In an embodiment, the projection system can include a first subcomponent providing low frequency adjustments and a second subcomponent providing high frequency adjustments.

In an embodiment, the subcomponent providing high frequency adjustments can include at least one element of the group consisting of electrostatic lenses, electrostatic deflectors and electrostatic stigmators.

In an embodiment, the objective lens can include a magnetic lens portion having a radial gap. The objective lens can have an upper pole piece with an upper pole piece boring, and a lower pole piece with a lower pole piece boring, wherein the upper pole piece boring is positioned closer to the charged particle source than the lower pole piece boring. An opening diameter of the upper pole piece boring can be smaller than a diameter of the lower pole piece boring.

In an embodiment, the charged particle beam system can further including a condenser with a first and a second condenser lens. The charged particle beam system can be configured to change a charged particle beam current density at the multi beam generator by changing excitations of the first and second condenser lenses.

According to another aspect of the disclosure, the charged particle beam system includes a charged particle source configured to generate a first charged particle beam, a multi beam generator configured to generate a plurality of charged particle beamlets from an incoming first charged particle beam, wherein each individual beamlet of the plurality of charged particle beamlets is spatially separated from other beamlets of the plurality of charged particle beamlets, an objective lens configured to focus incoming charged particle beamlets in a first plane in a manner that a first region in which a first individual beamlet of the plurality of charged particle beamlets impinges in the first plane is spatially separated from a second region in which a second individual beamlet of the plurality of charged particle beamlets impinges in the first plane, a projection system and a detector system including a plurality of individual detectors, wherein the projection system is configured to image interaction products leaving the first region within the first plane due to impinging charged particles onto a first one of the plurality of individual detectors and to image interaction products leaving the second region in the first plane due to impinging charged particles onto a second one of the plurality of individual detectors. The charged particle beam system can further include a magnetic beam splitter arranged between the multi beam generator and the objective lens. The magnetic beam splitter can be free of dispersion for a single pass of the charged particle beamlets passing the beam splitter.

According to another aspect of the disclosure, the charged particle beam system includes a charged particle source configured to generate a first charged particle beam, a multi beam generator configured to generate a plurality of charged particle beamlets from an incoming first charged particle beam, wherein each individual beamlet of the plurality of charged particle beamlets is spatially separated from other beamlets of the plurality of charged particle beamlets, an objective lens configured to focus incoming charged particle beamlets in a first plane in a manner that a first region in which a first individual beamlet of the plurality of charged particle beamlets impinges in the first plane is spatially separated from a second region in which a second individual beamlet of the plurality of charged particle beamlets impinges in the first plane, a projection system and a detector system including a plurality of individual detectors, wherein the projection system is configured to image interaction products leaving the first region within the first plane due to impinging charged particles onto a first one of the plurality of individual detectors and to image interaction products leaving the second region in the first plane due to impinging charged particles onto a second one of the plurality of individual detectors. The objective lens can include a magnetic portion having a radial gap.

According to another aspect of the disclosure, the charged particle beam system includes a charged particle source configured to generate a first charged particle beam, a multi beam generator configured to generate a plurality of charged particle beamlets from an incoming first charged particle beam, wherein each individual beamlet of the plurality of charged particle beamlets is spatially separated from other beamlets of the plurality of charged particle beamlets, an objective lens configured to focus incoming charged particle beamlets in a first plane in the form of an array of impingement locations, a projection system and a detector system including a plurality of individual detectors, wherein the projection system is configured to image interaction products leaving the impingement locations in the first plane onto the detector system within multiple secondary charged particle beamlets. The projection system can be configured to form three intermediate images of the impingement locations between the first plane and the detector.

According to a further aspect of the disclosure, the charged particle beam system includes a charged particle source configured to generate a first charged particle beam, a multi beam generator configured to generate a plurality of charged particle beamlets from an incoming first charged particle beam, wherein each individual beamlet of the plurality of charged particle beamlets is spatially separated from other beamlets of the plurality of charged particle beamlets, an objective lens configured to focus incoming charged particle beamlets in a first plane in the form of an array of impingement locations, and a projection system and a detector system including a plurality of individual detectors, wherein the projection system is configured to image interaction products leaving the impingement locations in the first plane onto the detector system within multiple secondary charged particle beamlets. The projection system can include a magnetic twin lens system having a first magnetic lens and a second magnetic lens, and wherein the projection system is configured, in operation, to form an intermediate image of the impingement locations between the first magnetic lens and the second magnetic lens of the magnetic twin lens system.

The first magnetic lens and the second magnetic lens, in operation, can have magnetic field directions which are inverse to one another.

According to a further aspect of the disclosure, the charged particle beam system includes a charged particle source configured to generate a first charged particle beam, a multi beam generator configured to generate a plurality of charged particle beamlets from an incoming first charged particle beam, wherein each individual beamlet of the plurality of charged particle beamlets is spatially separated from other beamlets of the plurality of charged particle beamlets, an objective lens configured to focus incoming charged particle beamlets in a first plane in the form of an array of impingement locations, and a projection system and a detector system including a plurality of individual detectors, wherein the projection system is configured to image interaction products leaving the impingement locations in the first plane onto the detector system within multiple secondary charged particle beamlets. The projection system can include a first charged particle lens or group of charged particle lenses forming, in operation, a crossover of the multiple secondary charged particle beamlets in a crossover plane and at least one intermediate image of the impingement locations, the projection system can further include a second charged particle lens or group of charged particle lenses configured, in a first mode of operation, to image the crossover of the multiple secondary charged particle beamlets onto the detector system, and in a second mode of operation to image the at least one intermediate image of the impingement locations onto the detector system.

The charged particle beam system can further include a diaphragm arranged in the crossover plane.

In a further embodiment, the projection system can include a combination of a magnetic lens and an electrostatic lens and can be configured to form a crossover of the multiple secondary charged particle beamlets.

BRIEF DESCRIPTION OF THE DRAWINGS

More details will be disclosed with reference to the attached drawings, in which:

FIGS. 9A-9H show components of a particular embodiment of the components within a primary beam path of a multi beam charged particle beam system;

FIG. 10 shows a sectional view of an alternative objective lens;

FIG. 11 provides a principle sketch of a charged particle beam projection beam path; and FIG. 12 provides a principle sketch of a charged particle beam projection beam path of another embodiment.

DETAILED DESCRIPTION OF EXEMPLARY EMBODIMENTS

Figure 1:
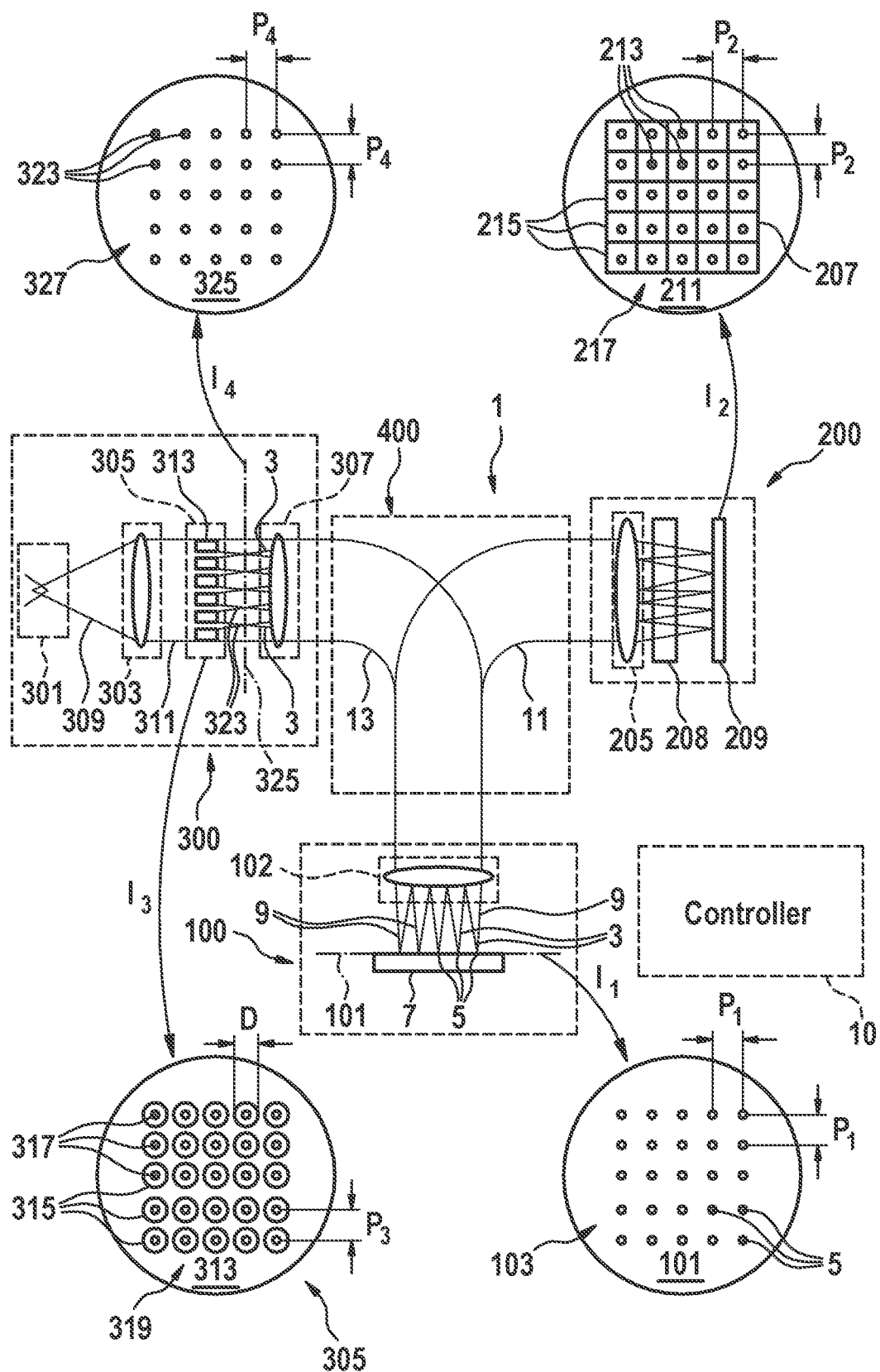
FIG. 1 shows a sketch of an embodiment of a multi beam charged particle system.

In the exemplary embodiments described below, components similar in function and structure are indicated as far as possible by similar reference numerals.

The schematic representation of FIG. 1 illustrates basic features and functions of a multi-beamlet charged-particle microscopy system 1. It is to be noted that the symbols used in the Figure do not represent physical configurations of the illustrated components but have been chosen to symbolize their respective functionality. The type of system shown is that of a scanning electron microscope (SEM) using a plurality of primary electron beamlets 3 for generating primary electron beam spots 5 on a surface of an object 7 located in an object plane 101 (hereinafter also referred to as sample and sample plane, respectively) of an objective lens 102. It goes however without saying that the features and functions of system 1 can also be implemented using instead of electrons other types of primary charged particles such as ions and in particular helium ions, positrons, muons, and others.

The microscopy system 1 shown includes a charged particle multi beamlet generator 300 for generating a plurality of primary charged-particle beamlets 3, a beam splitter unit 400 for separating the secondary charged particle beam path 11 from the primary charged particle beam path 13, an object irradiation unit 100 adapted to focus the primary charged particle beamlets 3 onto the object plane 101, and a detection unit 200 for creating individual intensity signals for each of the secondary charged particle beamlets 9.

In the embodiment illustrated, the primary beamlet generator 300 includes an electron source 301, a collimating lens 303, a primary beamlet forming unit 305, and a field lens 307.

The electron source 301 generates a diverging electron beam 309 that is collimated by the collimating lens to form a beam 311 incident on the primary beamlet forming unit 305. Instead of an electron source generating just one diverging electron beam 309 as shown in FIG. 1, an electron source creating two or more diverging electron beams may be used. The two or more electron beams are then collimated either by just one collimating lens 303 or by an appropriate number of collimating lenses 303, each collimating a subset or just one of the individual electron beams 309.

The beamlet forming unit 305 basically includes a first multi aperture plate illuminated by the one or more electron beams 311 and a second multi aperture plate located, with respect to the direction of movement of the electrons in beam 311, downstream of the first multi aperture plate. The second multi aperture plate is preferably set to a defined potential so that a focusing quality is conferred to the apertures and the second multi aperture plate takes on the function of a micro lens array.

The primary electrons incident on object 7 at a beam spot 5 generate secondary electrons emanating from the surface of the object 7. The secondary electrons form secondary electron beamlets 9, which traverse the objective lens 102 and the beam splitter unit 400 and follow the secondary beam path 11. The beam splitter unit 400 separates the secondary beam path 11 from the primary beam path 13 usually via magnetic fields and directs the secondary beam path 11 to a detection unit 200.

The detection unit 200 includes a projection lens 205 for projecting the secondary electron beamlets 9 onto a surface plane 211 of an electron sensitive detector 207 of a detector arrangement 209. The electron sensitive detector 207 can be a single device or include more than one individual detectors. Irrespective of this, detector 207 provides an array of sensing areas arranged in a pattern compatible to the pattern of the secondary charged particle beamlets 9 focussed by the projection lens 205 onto the detector surface 211. This enables a detection of each individual secondary charged particle beamlet 9 independent of the other secondary charged particle beamlets 9 incident on the detector surface 211. Thus a plurality of electrical signals is created, whereby the value of each signal corresponds to the characteristics of just one of the secondary beamlets 9.

If the primary beamlet generator 300 allows not only to change the patterns of the primary beamlets 3 such that each pattern forms a sub-pattern of a basic pattern, but also to change the basic pattern, the detector arrangement 209 is preferably equipped with further detectors 207, each having its sensing areas arranged in a different basic pattern. Since the patterns of the secondary beamlets 9 correspond to the patterns of the primary beamlets 3 generated by the primary beamlet generator 300, the sensing area array pattern of each detector 207 preferably corresponds to one of the patterns available for the primary beamlets 3.

The object irradiation unit 100 includes an objective lens 102 focussing the primary charged particle beamlets 3 onto the object plane 101 in which the investigated surface of an object 7 is positioned by an object mount like for example a sample stage. The object mount is not shown in the Figures. The object irradiation system 100 further includes a deflection system (not shown) by which the plurality of charged particle beamlets can be deflected in a direction perpendicular to the direction of beam propagation in order to scan the surface of the sample concurrently with the plurality of focused charged particle beamlets.

In the illustrated example, the primary charged particle source is implemented in form of an electron source 301 featuring an emitter tip and an extraction electrode. When using primary charged particles other than electrons, like for example helium ions, the configuration of the primary charged particle source 301 may be different to that shown.

The electron source 301 emits a divergent electron beam 309, which is collimated in the shown example by collimating lens 303 to form a collimated beam 311. The collimating lens 303 is usually formed by one or more electrostatic or magnetic lenses, or by a combination of electrostatic and magnetic lenses. The use of a collimating lens is not imperative, but it is preferred when the multi-aperture plates used in the beamlet forming unit 305 have a planar configuration, i.e. a configuration where the apertures 315 are arranged in a non-curved plane. When no collimating lens 303 is used, the apertures 315 of the multi aperture plates 313 and 320 are preferably arranged in a curved plane which curvatures are adapted to the divergence of the primary beam 309 as e.g. described in document WO 2007/028596 A1, which is hereby incorporated by reference.

The collimated beam 311 (or the non-collimated beam, if no collimating lens is used or if the lens setting does not provide collimation) is incident on the multi aperture selector plate 313 of the primary beamlet forming unit 305. The multi aperture selector plate 313 has two or more aperture arrays 317 formed therein. Each aperture array includes one or more apertures 315 formed in the multi aperture selector plate 313. The apertures of a multi aperture array may be arranged in a one-dimensional or in a two-dimensional pattern, whereby two-dimensional patterns are preferred for a fast inspection of an object's surface.

The detection system further includes a filter 208 with the aid of which interaction products leaving the sample 7 in the first plane 101 (for example secondary electrons) can be filtered according to their trajectories or beam paths. An example of a respective detection system with a filter is shown in FIG. 2.

The multi beam system further includes a computer system or controller 10 which is configured to control the individual charged particle beam components as well as for evaluating and analyzing images recorded with multi detector 209. In addition the controller 10 is configured to generate images based on the detection signals gathered with multi detector 209 on a display.

Figure 2:
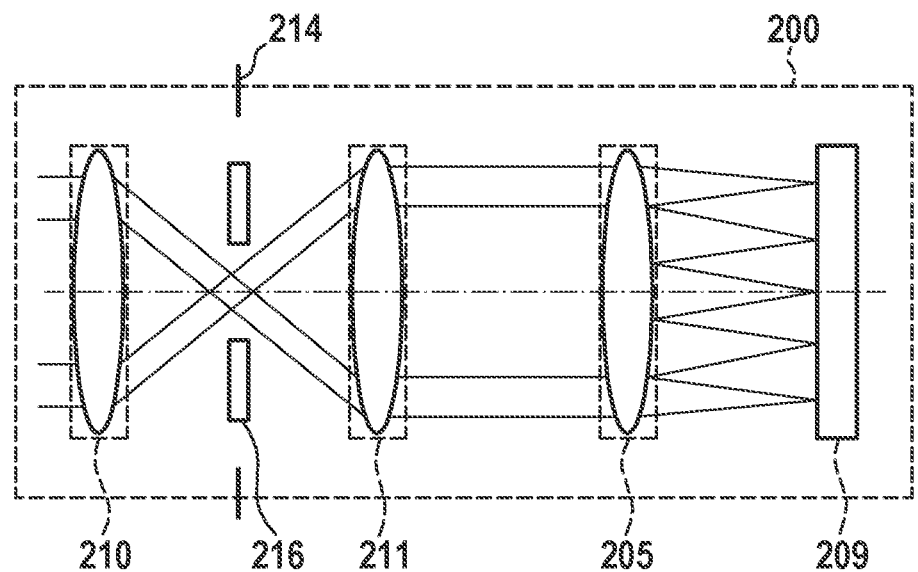
FIG. 2 shows a sketch of a detection system of a first embodiment.

The detection system 200 in FIG. 2 includes in addition to the projection lens 205 and the multi detector 209 two additional charged particle lenses 210, 211. The first additional charged particle lens 210 forms a crossover in a crossover plane 214. In this crossover plane the beam paths of the interaction products which leave the first plane 101 in different regions, i.e. the beam paths of the secondary electron beamlets, are superimposed. The second additional charged particle lens 211 is operated so that its focal plane substantially coincides with the crossover plane 214 of the first additional charged particle lens 210. The beam paths of the interaction products leaving the first plane 101 then run separated from each other downstream of the second additional charged particle lens 211 and are projected by projection lens 205 onto separate detection regions 215 of the multi detector 209.

Figure 6:
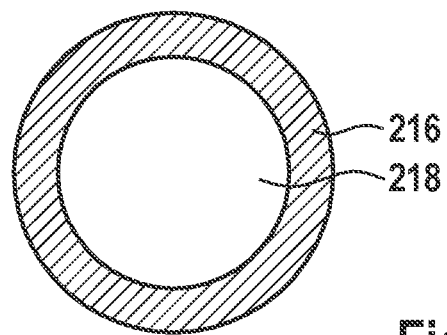
FIG. 6 shows a diaphragm which can be provided in the projection system to achieve a filtering of the secondary charged particle beamlets.

In the crossover plane 214 or in the neighborhood thereof a diaphragm 216 is arranged with the aid of which the interaction products can be filtered according to their beam paths. A first embodiment for a diaphragm is shown in FIG. 6 which includes a circular opening 218. The circular opening 218 is transmissive for interaction products while an outer portion of the diaphragm 216 is non-transmissive for the interaction products. With such kind of bright-field diaphragm in the crossover plane of the projection system a crosstalk between different individual detection fields, i.e. a crosstalk between the beam paths of interaction products leaving the first plane 101 in a first region and a detector assigned to interaction products leaving the first plane 101 in a second region different from the first region, can be avoided or at least reduced.

For a high frequency adjustment of the projection system in FIG. 2 additional dynamic elements such as electrostatic lenses, electrostatic deflectors and electrostatic stigmators can be provided in addition to the elements shown in FIG. 2 arranged in a similar manner and controlled in a similar manner as described with reference to FIG. 4 hereinafter. Also the detector scheme for recording images of the spots generated by the secondary charged particle beamlets can be configured as described in more detail hereinafter with reference to FIG. 4.

Regarding further details of the system shown in FIG. 2 and the diaphragm shown in FIG. 6 reference is made to the description of the respective Figures in WO2016/124648 the disclosure of which with respect to the respective FIGS. 2 and 6 thereof is hereby incorporated by reference.

Figure 7:
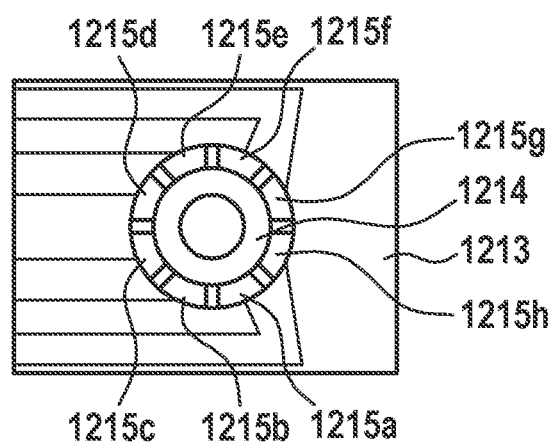
FIG. 7 depicts an embodiment of a aperture diaphragm with crossover monitoring capabilities for an angle dependent current readout for crossover position correction.

An alternative embodiment for a diaphragm in a detection system 200 is shown in FIG. 7. The diaphragm 1213 also has a circular opening 1214 which is transmissive for interaction products. However the circular opening is surrounded in a radial direction by a couple of electrodes 1215a to 1215h which are electrically insulated with respect to each other as well as with respect to the body of the diaphragm. The electrodes can serve as current detectors. Each electrode includes a signal line via which an electrical current induced within each electrode can be detected. By detecting asymmetries in the currents or charges induces in the set of electrodes 1215a to 1215h a decentering of the charged particle beamlets passing the aperture of the diaphragm can be detected.

In an alternative embodiment, instead of electrodes being arranged around the circular opening 1214 a scintillating material can be provided on the surroundings of the circular opening, and furthermore light detectors are provided to detect light emitted by the scintillating material due to impinging electrons. By detecting asymmetries in the light emission of the scintillating material a decentering of the charged particle beamlets passing the diaphragm 1213 can be detected.

Figure 8:
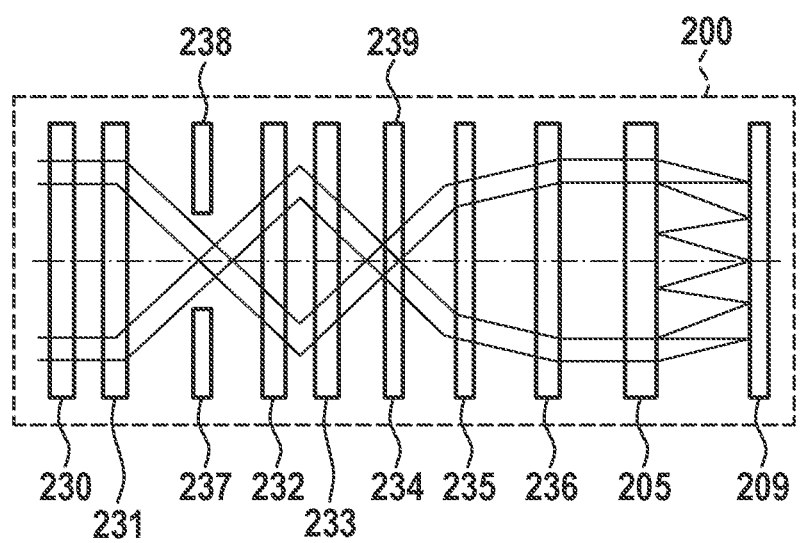
FIG. 8 depicts a further embodiment of a detection system.

The diaphragm shown in FIG. 7 as well as the above described alternative embodiment for a diaphragm can be used as a in-situ crossover monitor if arranged in the crossover plane 214 of the detection system shown in FIG. 2 or the crossover plane 238 of FIG. 8. Accordingly, the projection system includes a current monitoring aperture in a crossover plane.

FIG. 8 shows an alternative of a detection system providing the possibility of filtering interaction products according to their beam paths. FIG. 8 is identical to FIG. 4 in WO2016/124648 and regarding a description of this detection system and its capabilities and advantages it is referred to the respective description of FIG. 4 in WO2016/124648, which is hereby incorporated by reference. It should especially be noted that the system shown in FIG. 8 (or FIG. 4 in WO2016/124648) forms a crossover-zoom system as this also is described in more detail in WO 2016/124648.

In addition to the projection lens 205 and the multi detector 209, the detection system 200 in FIG. 8 has six further charged particle lenses 230, 231, 232, 233, 235, 236. The two first further charged particle lenses 230, 231 form a first crossover of the secondary charged particle beamlets in a first crossover plane 238, the two subsequent further charged particle lenses 232, 233 form a second crossover of the secondary charged particle beamlets in a second crossover plane 239. The two further charged particle lenses 235, 236 following the second crossover plane 239 recollect the secondary charged particle beamlets of the interaction products emerging from the second crossover plane 239 in such a way that the interaction products emerging from the various field regions in the first plane 101 are again projected onto various detection regions 215 of the multi detector 209 with the aid of the projection lens 205 on the multi detector 209.

In this embodiment of the detector system 200, two different stops 237, 234 can be used simultaneously in the first and in the second crossover plane 238 and 239. By way of example, the bright field stop 213 depicted in FIG. 6 can be arranged in the first crossover plane 238 and the stop with a ring-shaped aperture can be arranged in the second crossover plane 239. The suppression of crosstalk between the detection regions 215 and the targeted filtering of the interaction products according to the start angle thereof in the first plane 101 is carried out simultaneously in this embodiment.

Here, attention is drawn to the fact that the two stops 237, 234 can also be arranged in an interchanged manner such that a stop with a ring-shaped aperture is arranged in the first crossover plane 238 and a stop with a central aperture is arranged in the second crossover plane 239.

By varying the excitations of the further charged particle lenses 230, 231, 232, 233, 234, 235, it is possible to set the trajectories of the secondary charged particle beamlets independently of one another in the two crossover planes 238, 239. By varying the trajectories in the crossover planes 238, 239, it is possible to simulate different stop radii and stop diameters, without stops needing to be mechanically interchanged therefore. The trajectories when entering into the detector system 200 and when entering into the projection lens 205 can be kept constant in this case such that the association between the field regions in the first plane 101 and the detection regions of the multi detector 209 can be maintained. The object field transmitted by all of the secondary charged particle beamlets in the first plane 101 remains unchanged and constant in the system.

In this case, the further charged particle lenses 230, 231, 232, 233, 235, 236 can be either magnetic lenses or electrostatic lenses.

In the embodiment of FIG. 8, the six further charged particle lenses 230, 231, 232, 233, 235, 236 form a projection system together with the two stops 234, 237 and the projection lens 205.

For a high frequency adjustment of the projection system in FIG. 8 again additional dynamic elements such as electrostatic lenses, electrostatic deflectors and electrostatic stigmators can be provided in addition to the elements shown in FIG. 8 arranged in a similar manner and controlled in a similar manner as described with reference to FIG. 4 hereinafter. Also the detector scheme for recording images of the spots generated by the secondary charged particle beamlets can be configured as described in more detail hereinafter with reference to FIG. 4.

Figure 3:
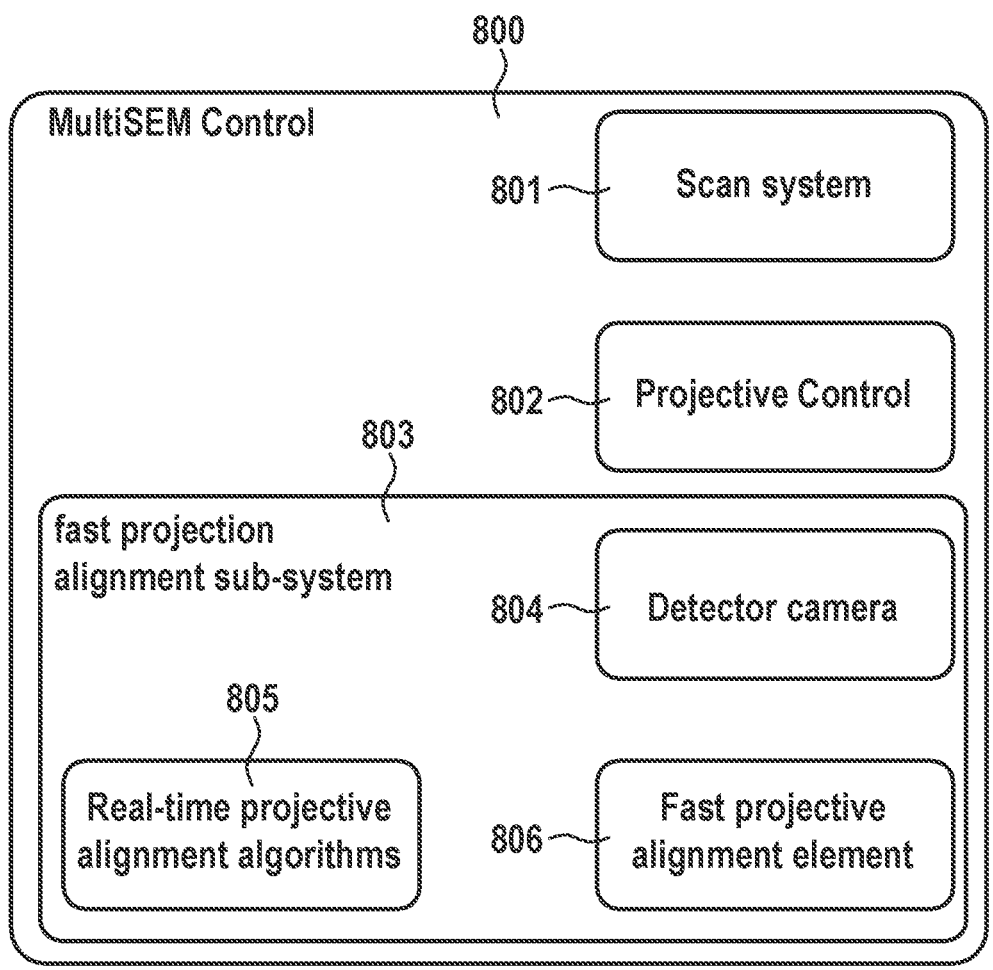
FIG. 3 shows a block diagram of a portion of a multi beam projection control with a fast (dynamic) subcomponent for the projection system control in the beampaths of secondary electron beamlets.

FIG. 3 is a block diagram of a portion of the control system 800 (which corresponds to the control system 10 in FIG. 1) of the multi beam charged particle beam system. The control system 800 includes a scan system control component 801 and a control 802 for the static or low frequency subcomponents of the projection system for adjusting the charged particle lenses and multipoles. The control system 800 further includes a fast projection alignment sub-system including a detector camera 804 (corresponding to the spatially resolved detection system 290 in FIG. 4), real-time projective alignment algorithms 805 and one or more fast projective alignment element(s). The control system shown in FIG. 3 especially can be used for controlling, inter alia, a projection system as shown in FIG. 4 and described in more detail hereinafter.

Figure 4:
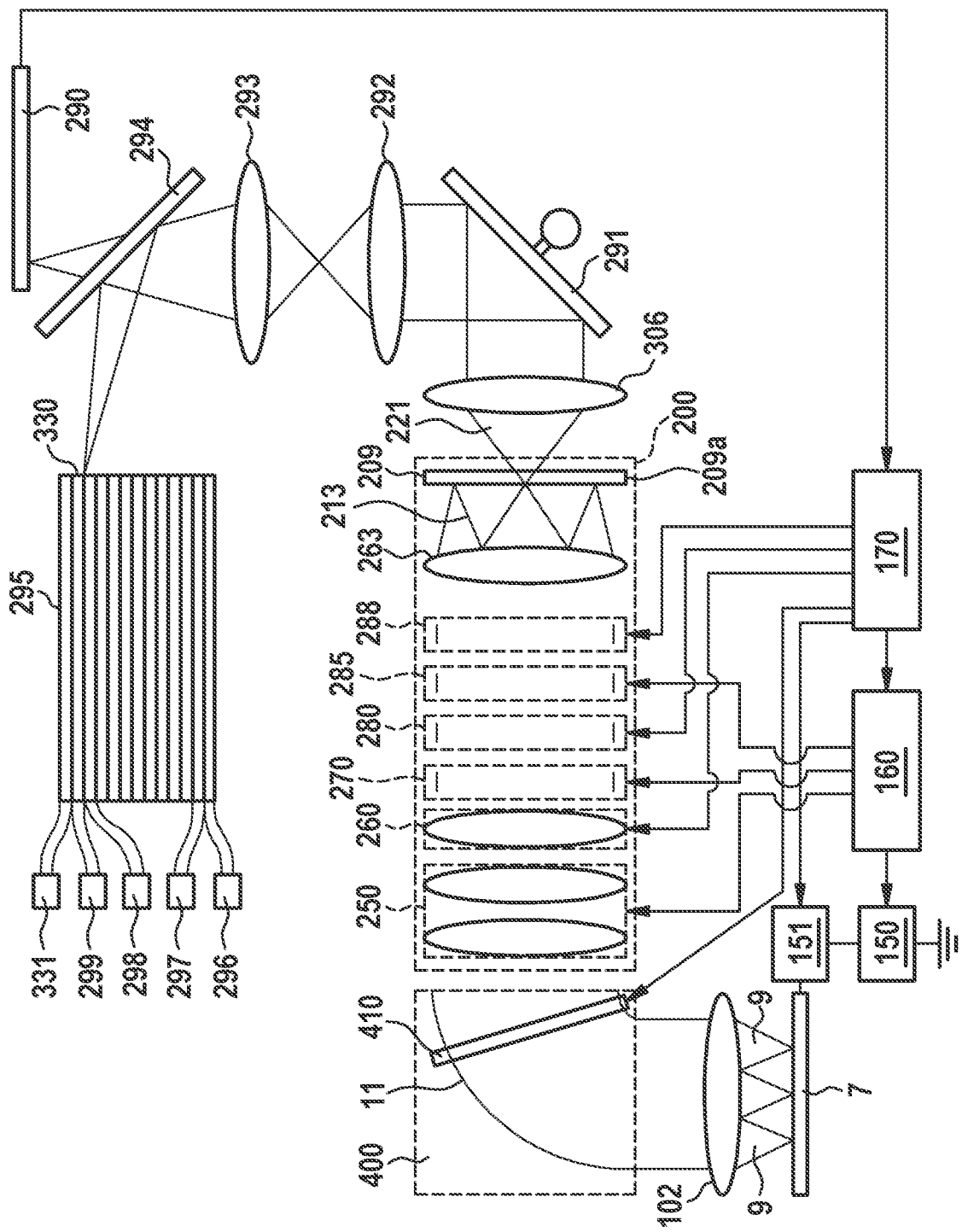
FIG. 4 shows a sketch of a projection path with additional electrostatic deflectors, electrostatic stigmators, electrostatic lenses, a beam splitter deflector and a starting energy HV supply.

The projection system 200 in FIG. 4 includes a set of static (or low frequency) electron optical elements 250, 270, and 285, and a set of dynamic (or high frequency) electron optical elements 260, 280, and 288. The static electron optical elements are used for imaging of secondary electrons (SE) 3 from sample 7 onto the detection plane 209a. These can include one or more charged particle lenses 251, deflectors 271, and/or stigmators 286. As slow alignment times are sufficient in the static case, magnetic lenses, magnetic deflectors, and magnetic stigmators are used. A controller 160 controls the static electron optical elements 250, 270, and 285, as well as the static sample potential via a static voltage supply 150. To this end, the controller uses a spatially resolving detection system 290 that uses a fraction of the signal impinging onto the detection plane 209a. For example, a spatially resolved detection system 290 can include a fast CCD camera that images a fraction of the light emanating from spots from the detection plane 209a, where a plate made of a scintillating material placed onto a transparent carrier can be arranged to form a multi detector 209. Most of the signal produced in the detection plane 209a is used for feeding into the image acquisition system. The image acquisition system also forms part of the multi detector.

As described above, in the detection plane 209a a scintillator plate 209 is arranged onto which the secondary electron beamlets are directed by the projection system 200. The projection system 200 includes, when integrated in the multi beam inspection system of FIG. 1, electron optical components forming the electron beamlets 9, i.e., for example the objective lens 102 guiding the electron beamlets towards the multi electron detector, the beam switch 400 and components focusing the electron beamlets 9 onto the surface of the scintillator plate 209 such as the lens 263. The electron beamlets 9 are incident onto the scintillator plate 209 at locations of incidence 213. Also if the electron beamlets 9 are focused onto the surface of the scintillator plate 209, beam spots are formed on the surface, the diameter of which cannot be arbitrarily small. The centers of the beam spots may be considered as the locations of incidence 213 disposed from each other at the distance P2 (see FIG. 1).

The scintillator plate 209 includes a scintillator material emitting light beams when excited by the incident electrons of the electron beamlets 9. Therefore, at each of the locations of incidence 213 a source of light beams is disposed. In FIG. 4, only a single such light beam 221 is shown emitted from the location of incidence 213 of one of the three depicted electron beamlets 9. The light beam 221 propagates through light optics including a first lens 306, a mirror 291, a second lens 292, a third lens 293 and a beam splitter 294 and is then incident onto a light receiving area 330 of the image acquisition system. The light receiving area 330 is formed by a front side of a bundle of glass fibers 295 into which a major portion of the light beam 221 is coupled and guided to light detectors 296, 297, 298, 299, 331. The light detectors may include, for example, photo multipliers, avalanche-photodiodes, photodiodes or other kinds of suitable light detectors. The light optics are configured so that it optically images the surface of the scintillator plate 209 arranged in the detection plane 209a into a region where the light receiving area 330 is disposed. Due to this optical imaging optical images of the locations of incidence 213 are formed in the light receiving area 330. For each of the locations of incidence 213 a separate light receiving area 330 of the image acquisition system is provided. Each of the further light receiving areas 330 can be formed by a front side of a light guide 295 guiding the light coupled into the front side to a separate respective light detector 296, 297, 298, 299, 331. Due to the optical imaging each of the locations of incidence 213 is associated with a light receiving area 330 wherein the light incident onto each of the light receiving areas 330 is detected by a separate one of the light detectors 296, 297, 298, 299, 331. The light detectors 296, 297, 298, 299, 331 output detection signals via electric signal lines. The detection signals represent intensities of the secondary electron beamlets 9.

It should be mentioned that in FIG. 4, for simplification, only five light detectors 296, 297, 298, 299, 331 are shown. In a realistic embodiment the number of light detectors 296, 297, 298, 299, 331 corresponds at least to the number of primary charged particle beamlets and the number of secondary electron beamlets 9. In a preferred embodiment the image acquisition system includes even more light detectors 296, 297, 298, 299, 331 than the number of primary charged particle beams, for example five, ten or twenty light detectors for each secondary electron beamlet. A number of more than one light detector for each primary electron beamlet provides additional flexibility in assigning light detectors to a particular secondary charged particle beamlet.

A small portion of the light beam 221 transmits the beam splitter 294 and impinges onto the spatially resolving detection system 290 which can be a fast CCD camera.

In the embodiment elucidated herein, the light detectors 296, 297, 298, 299, 331 are disposed at a distance from the light receiving areas onto which the light optics (including the first lens 306, the mirror 291, the second lens 292, the third lens 293 and the beam splitter 294) image the scintillator plate 209 and the received light is guided to the light detectors by glass fibers. However, it is also possible that the light detectors 296, 297, 298, 299, 331 are directly disposed where the light optics generate the image of the scintillator plate 209 and the light sensitive areas are thus formed by the light receiving areas.

The secondary electron beamlets 9 propagate in a vacuum and also the surface of the scintillator plate 209 onto which the electron beamlets impinge is disposed in the vacuum. The light optics 306, 291, 292, 293, 294 may be disposed outside the vacuum wherein, then, a vacuum window is provided in the beam path of the light beam 221, the vacuum window being traversed by the beam 221 and separates the vacuum from the environment.

Detection of multiple beamlets of secondary charged particles can also be achieved with detection systems other than the combination of a scintillator, light optics, a fibre bundle and a light detector scheme as described above. It is also possible to use a combination of an MCP (Multi-Channel Plate) and a fast CCD camera with subsequent fast readout, or a direct electron detector where each secondary charged particle beamlet is imaged onto one or multiple pixels consisting of pn junctions that directly convert the incoming charged particles into an electric readout signal without intermediate conversion to photons and back. The adaption of the alignment schemes described below will be straightforward also for such alternative detection schemes.

The electron beams incident onto the scintillator plate 209 may ionize residual gas molecules in the region in front of the scintillator plate resulting in electric charges at the locations of incidence 213 and the charges may, in turn, attract residual gaseous contaminant in the vacuum so that the contaminant is deposited at the locations of incidence 213 on the scintillator plate 209 and result in the deterioration of the properties of the scintillator material so that the intensity of the light beams 221 caused by the incident secondary electron beamlets 9 decreases over time. This problem can be coped with by displacing the locations of incidence 213 in a direction orthogonal to a surface normal of the scintillator plate 209, i.e. within the detection plane 209a. With this, the secondary electron beamlets 9 are not always incident onto the surface of the scintillator plate at the same locations of incidence 213 but are moved over the surface of the scintillator plate 209 and, therefore, moved to ever new locations on its surface. A contamination occurring at distinct locations on the surface of the scintillator plate 209 then does not hinder the generating of light at the locations of incidence 213 caused by the incident secondary electron beamlets 9.

The dynamic electron optical elements are used for dynamically correcting residual imaging errors of secondary electrons (SE) 3 from sample 7 onto the detection plane 209a that are not accounted for by the static imaging system. These residual imaging errors can occur during the scanning of charging surfaces where the imaging properties and constraints, such as starting energy of the secondary electrons or starting angle distribution of the secondary electrons can change within one frame of imaging. These dynamic elements can include one or more charged particle lenses 260, deflectors 280, and stigmators 288. As fast alignment times are used in the dynamic case, only electrostatic components such as electrostatic lenses, electrostatic deflectors, and/or electrostatic stigmators are preferably used. A dynamic controller 170 controls the dynamic electron optical elements 260, 280, and 288, as well as the dynamic sample potential added to the static potential via voltage supply 151. To this end, the dynamic controller 170 uses the spatially resolving detection system 290 that uses a fraction of the signal impinging onto the detection plane 209a. The beam splitting device 400 consists of magnetic sectors that are statically aligned. A fast electrostatic deflection element 410 within the beam splitting device 400 is controlled as well by dynamic controller 170.

A further controller 160 controls the static or low frequency properties and components.

A final charged particle lens 263 for producing the spots on the detection plane 209a can be either of the static or dynamic type and controlled by controller 160 or 170, respectively.

Figure 5A:
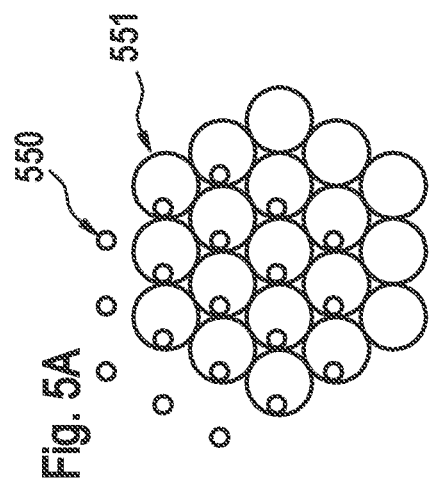
FIGS. 5A-5F illustrate corrections achieved with the dynamic subcomponent of the projection systems in cases of particular distortions caused by sample charging.
Figure 5B:
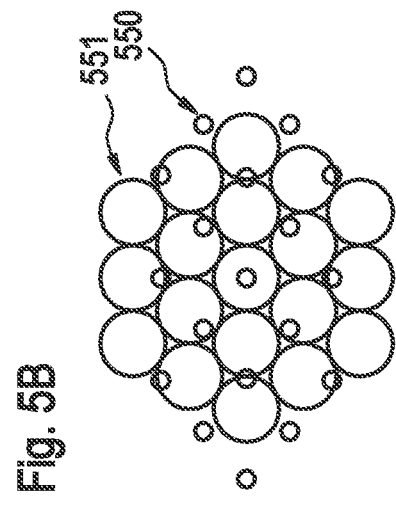
Figure 5C:
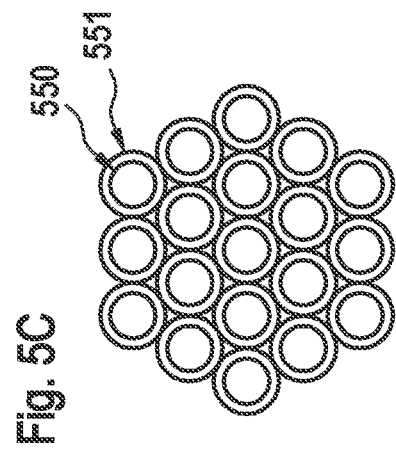
Figure 5D:
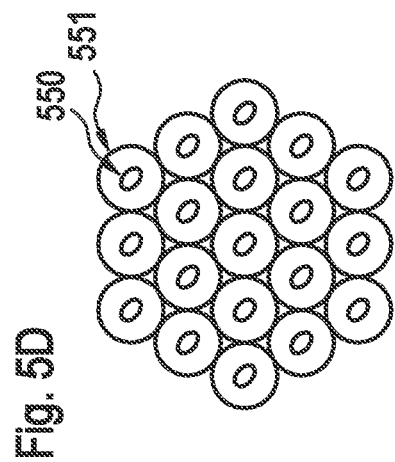
Figure 5E:
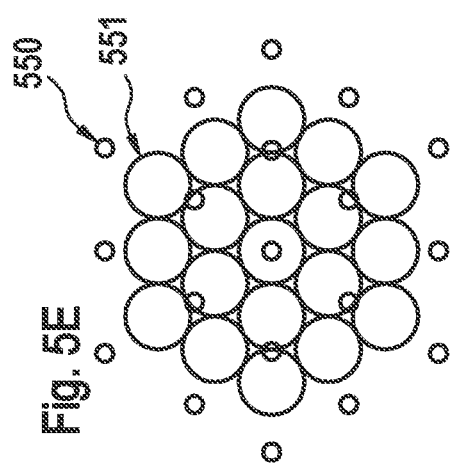
Figure 5F:
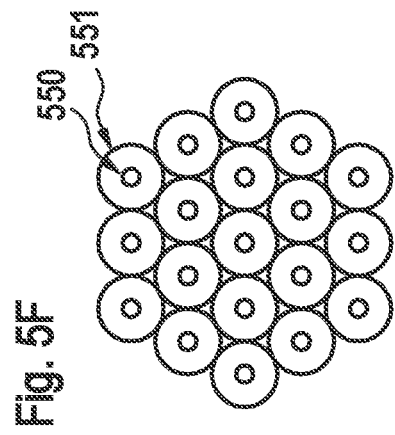

In FIGS. 5a to 5f circles 551 depict the areas on the spatially resolved detection system 290 that correspond to the sensitive areas of the corresponding detectors of the image acquisition system and, accordingly, to the ideal positions of the secondary electron beamlets in the detection plane 209a. The mapping between these areas on spatially resolved detection system 290 and the sensitive areas of the image acquisition detectors is fix and can be calibrated upfront (for reference, see U.S. Pat. No. 9,336,982 B2 and references therein, which are hereby incorporated by reference). Circles 550 depict the position distribution of the secondary electron beamlets imaged by projection system 200 onto the detection plane 209a. FIG. 5A depicts a shift between the position distribution of the secondary electron beamlets 550 and the sensitive areas 551. Using fast deflection systems 280, this can be corrected to yield the correct positioning of the secondary electron beamlets 550 onto the sensitive areas 551 shown in FIG. 5F. To achieve this, the shift between the position distribution of the secondary electron beamlets 550 and the sensitive areas 551 is determined by recording and analyzing an image recorded by the spatially resolved detection system 290. Appropriate deflection potentials for the fast deflection system 280 are determined by the real-time projective alignment algorithms 805 by analyzing the recorded image, and the thus determined deflection potentials are applied to the fast deflection system 280 by dynamic controller 170. The deflection potentials are determined in a manner that with the appropriate potentials applied to the fast deflection system 280 the positions of the secondary electrons 550 coincide with the centers of the sensitive areas 551 as shown in FIG. 5F.

FIG. 5B depicts a distortion of the position distribution of the secondary electron beamlets 550 relative to the sensitive areas 551. Using fast stigmation systems 285, this can be corrected to yield the correct positioning of the secondary electron beamlets 550 onto the sensitive areas 551 shown in FIG. 5F. To achieve this, the distortion of the position distribution of the secondary electron beamlets 550 is determined by recording an image by the spatially resolved detection system 290, analyzing the image recorded by the spatially resolved detection system 290 by real-time projective alignment algorithms 805 and determining, based on the image analysis, appropriate stigmator voltages for the fast stigmation system 285. Keeping the spot stigmations correct at the same time involves the use of at least two stigmators, as described in great detail in US 20150357157 A1 which is hereby incorporated by reference. The stigmator voltages are determined by the real-time projective alignment algorithms 805 in a manner that with the appropriate voltages applied to the fast stigmation system 285 the positions of the secondary electron beamlets 550 coincide with the centers of the sensitive areas 551 as shown in FIG. 5F. The respectively determined stigmator voltages are applied to the fast stigmation system 285 by dynamic controller 170.

FIG. 5C depicts a defocus of the secondary electron beamlets 550 with respect to the sensitive areas 551. Using fast lens systems 260, this can be corrected to yield the correct focusing of the secondary electron beamlets 550 onto the sensitive areas 551 shown in FIG. 5F. To achieve this, the defocus of the secondary electron beamlets 550 at the sensitive areas 551 is determined by recording and analyzing, by real-time projective alignment algorithms 805, an image recorded by the spatially resolved detection system 290. Keeping the spot positions correct at the same time involves the use of at least two lenses, as described in great detail in US 20150357157 A1 which is hereby incorporated by reference. Appropriate voltages for the fast lens systems 260 are determined by the real-time projective alignment algorithms 805 and applied to the fast lens systems 260 by dynamic controller 170 in a manner that with the appropriate voltages applied to the fast lens systems 260 the positions of the secondary electron beamlets 550 coincide with the centers of the sensitive areas 551 and the diameters of the light spots on the spatially resolved detection system 290 are minimized or have the appropriate dimensions as shown in FIG. 5F.

FIG. 5D depicts an astigmatic imaging of the secondary electron beamlets 550 onto the sensitive areas 551. Using fast stigmation systems 285, this can be corrected to yield the correct shape of the secondary electron beamlets 550 onto the sensitive areas 551 shown in FIG. 5F. Keeping the spot positions correct at the same time involves the use of at least two stigmators, as described in great detail in US 20150357157 A1 which is hereby incorporated by reference. To achieve stigmation, the astigmatic imaging of the secondary electron beamlets 550 is determined by recording and analyzing an image recorded by the spatially resolved detection system 290. Appropriate stigmator voltages for the fast stigmation system 285 are determined by the real-time projective alignment algorithms 805 and such stigmator voltages are applied to the fast stigmation system 285 by dynamic controller 170. The stigmator voltages are determined, based on the image analysis, in a manner that with the appropriate voltages applied to the fast stigmation system 285 the form of the beam spots of the secondary electron beamlets 550 become circular with their centers in the centers of the sensitive areas 551 as shown in FIG. 5F.

FIG. 5E depicts a magnification change in the imaging of the secondary electron beamlets 550 with respect to the sensitive areas 551. Using fast lens systems 260, this can be corrected to yield the correct positioning of the secondary electron beamlets 550 onto the sensitive areas 551 shown in FIG. 5F. Keeping the spot focusing correct at the same time involves the use of at least two lenses, as described in great detail in US 20150357157 A1 which is hereby incorporated by reference. To achieve this, the magnification change of the secondary electron beamlets 550 at the sensitive areas 551 is determined by recording and analyzing an image recorded by the spatially resolved detection system 290. Appropriate voltages for the fast lens systems 260 are determined by the real-time projective alignment algorithms 805, based on the image analysis, and applied to the fast lens systems 260 by dynamic controller 170. The appropriate voltages are determined by the real-time projective alignment algorithms 805 in a manner that with the appropriate voltages applied to the fast lens systems 260 the positions of all the secondary electron beamlets 550 coincide with the centers of the sensitive areas 551 and the diameters of the light spots on the spatially resolved detection system 290 are minimized or have the appropriate dimensions as shown in FIG. 5F.

Above, with respect to FIG. 5A to 5F only the correction of individual distortions is described. However, the real-time projective alignment algorithms 805 advantageously are configured also to determine appropriate potentials and voltages for the fast alignment components if the images recorded with the spatially resolved detection system 290 show combinations of the described distortions. Appropriate voltages for the electrostatic lenses, the electrostatic stigmators and the electrostatic deflectors then are determined by the real-time projective alignment algorithms 805 concurrently or sequentially in iterative steps.

The recording of the images with the spatially resolved detection system 290 takes place before an image of the sample is recorded by the aid of the multi detector or while portions of the image of the sample are recorded by the aid of the multi detector, for example after a predetermined number of lines has been scanned by the plurality of primary electron beamlets.

In the embodiment shown in FIG. 4 one or more elements 260, 280, 288 of the subcomponent providing high frequency adjustments also can include an electrostatic micro-optics array, such as an electrostatic micro-lens array, an electrostatic micro-deflector array or an electrostatic micro-stigmator array by which the individual secondary electron beamlets can be influenced individually. A respective electrostatic micro-optics array can include a multi aperture array with an electron transmissive opening for each secondary electron beamlet and a number of one, two or more, i.e. for example three, four, six or eight, electrodes surrounding each opening. Multiple electrodes are electrically insulated with respect to each other and with respect to a carrier of the multi aperture array. By applying appropriate voltages to the individual electrodes surrounding each opening the secondary electron beamlet transmitting such opening can be adjusted or changed individually with high frequency.

An example of a design for a multi-beam illumination beam path of a multi beam charged particle beam system is shown in FIGS. 9A to 9H.

Figure 9B:
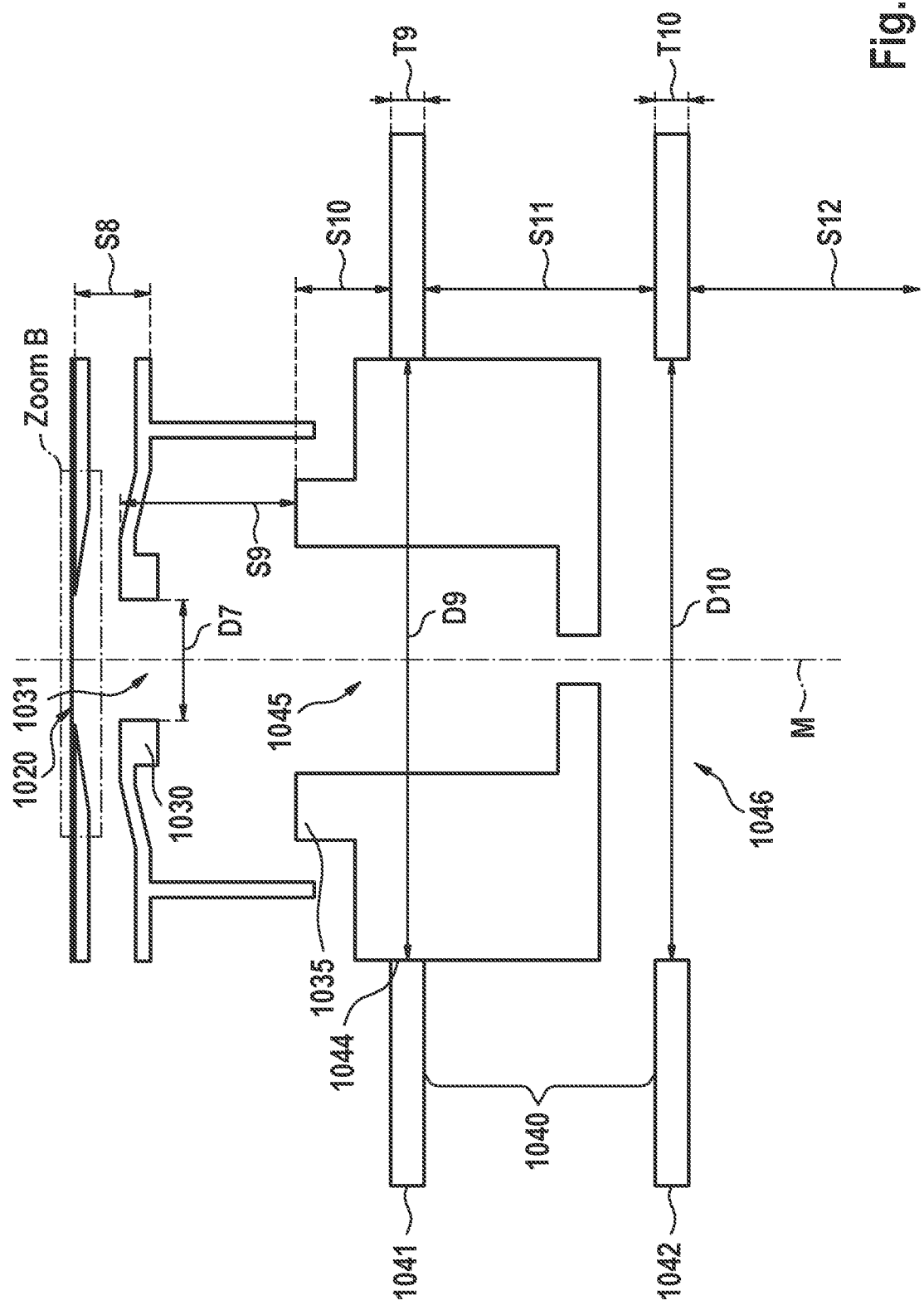
Figure 9D:
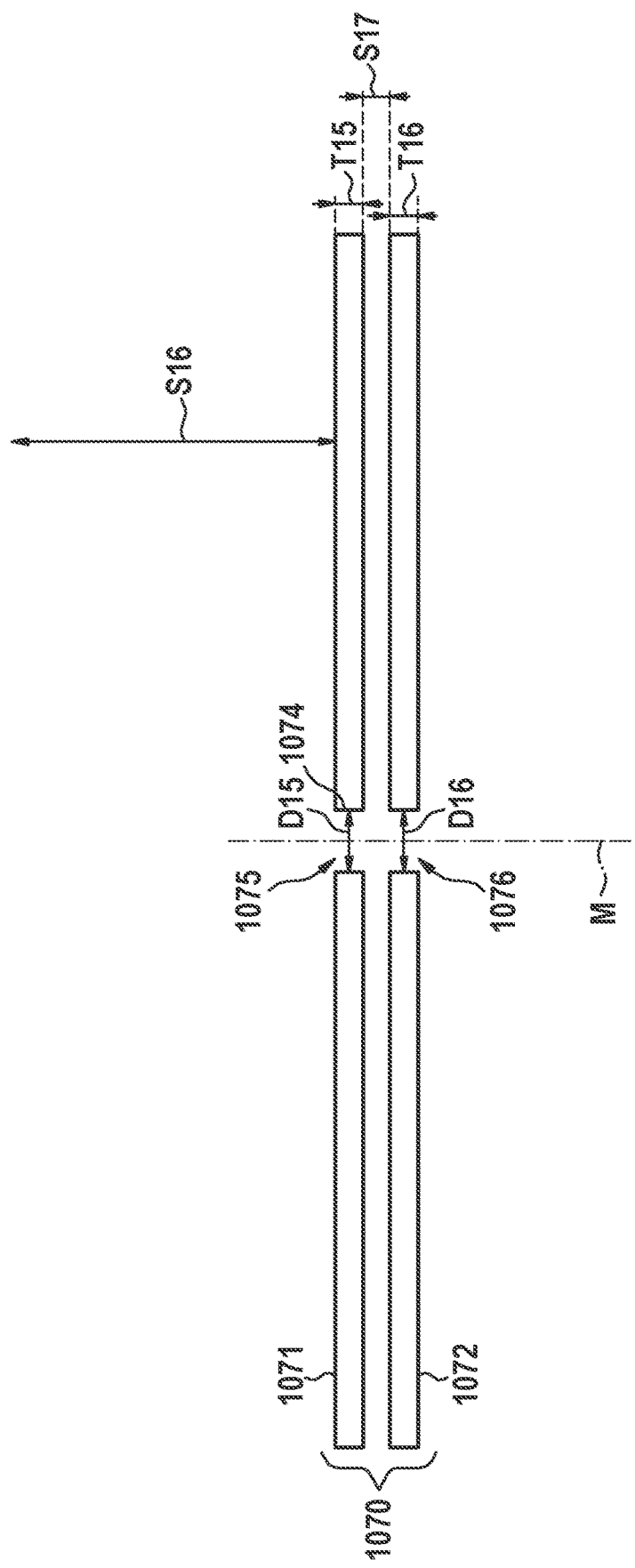
Figure 9F:
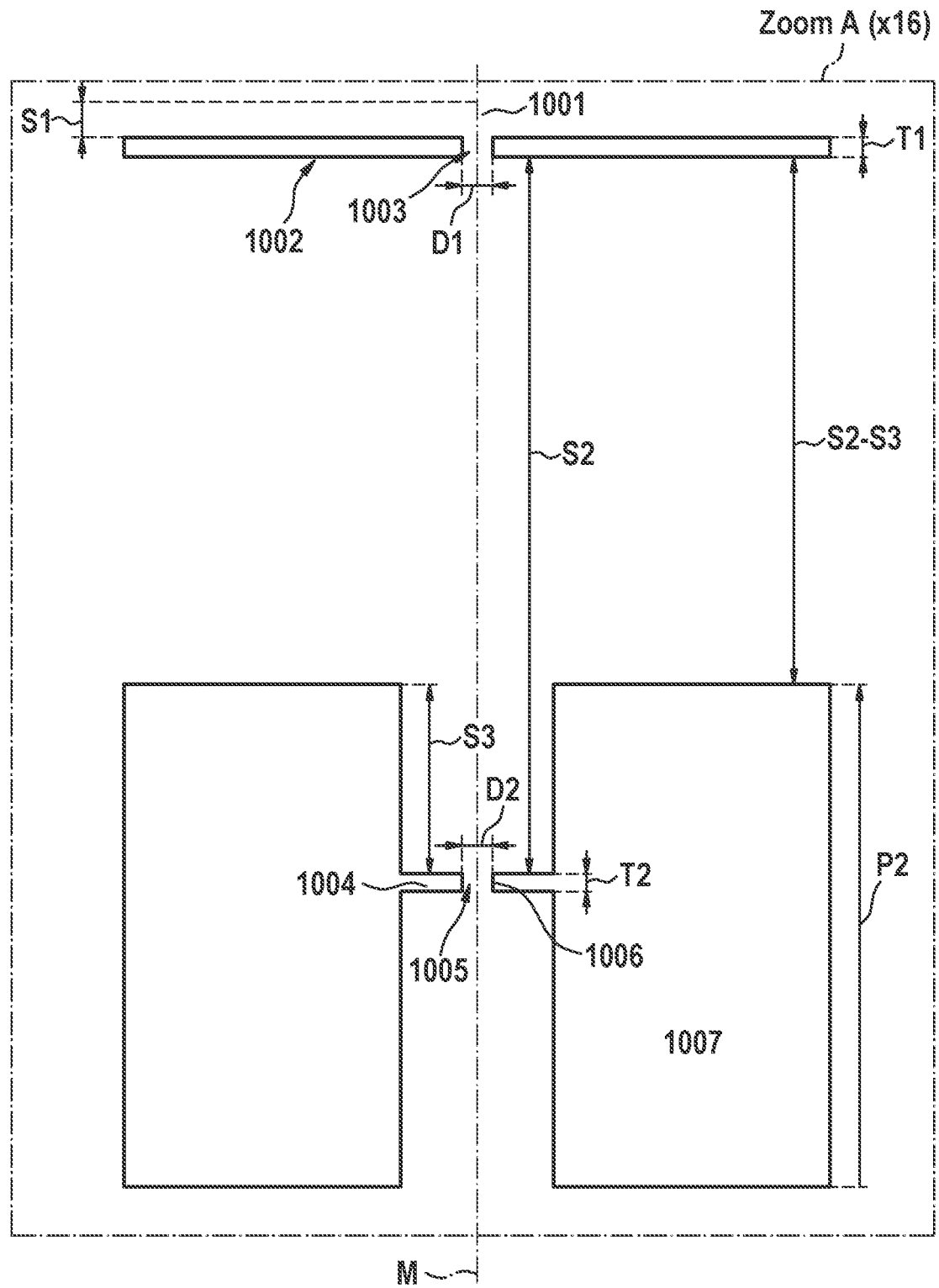

FIGS. 9A and 9F show the upper part of a set-up for the illumination beam path. The system has a cathode 1001 and an extractor electrode 1002 arranged at a distance S1 from cathode 1001. The extractor electrode has a thickness T1 in the direction of an optical axis M and a central opening 1003 having an opening diameter D1. The center of the opening 1003 coincides with the optical axis M. The distance S1 can be in the range between 0.3 mm and 0.8 mm, more preferable in the range between 0.4 mm and 0.6 mm, even more preferable in the range between 0.45 mm and 0.55 mm. The thickness T1 can be in the range between 0.1 mm and 0.5 mm, more preferable in the range between 0.2 mm and 0.4 mm, even more preferable in the range between 0.25 mm and 0.3 mm. The diameter D1 of the opening 1003 of the extractor electrode 1002 can be in the range between 0.1 mm and 1.0 mm, more preferable in the range between 0.3 mm and 0.6 mm, even more preferable in the range between 0.4 mm and 0.5 mm.

In operation, the extractor electrode 1002 is biased with a positive electrical extraction potential U1 relative to the cathode 1001. The extraction potential can be in the range between 2 kV and 10 kV positive relative to cathode 1001, more preferable in the range between 3 kV and 7 kV, even more preferable in the range between 4 kV and 5 kV positive relative to cathode 1001.

Following in the direction of charged particles emitted along the optical axis an anode electrode 1004 is arranged at a distance S2 from extractor 1002. The distance S2 between the extractor 1002 and the anode 1004 can be in the range between 5 mm and 15 mm, more preferable in the range between 7 mm and 12 mm, even more preferable in the range between 10 mm and 11 mm. The anode 1004 has a central opening 1005 having an opening diameter D2 aligned with the optical axis M. The diameter D2 of the opening 1005 of the anode 1004 can be in the range between 0.1 mm and 2.0 mm, more preferable in the range between 0.3 mm and 1.0 mm, even more preferable in the range between 0.4 mm and 0.8 mm. The anode 1004 has a thickness T2 at a central portion 1006 close to the optical axis M and measured in the direction of the optical axis M and the thickness T2 can be in the range between 0.1 mm and 0.5 mm, more preferable in the range between 0.2 mm and 0.4 mm, even more preferable in the range between 0.25 mm and 0.3 mm. To increase mechanical stability of the anode 1004 the anode 1004 can have a larger thickness P2 in a region 1007 peripheral from the optical axis M. The thickness P2 can be in the range between 5 mm and 10 mm, more preferable in the range between 6.5 mm and 8.5 mm, even more preferable in the range between 7.2 mm and 7.8 mm. In the example shown in FIG. 9F the central portion 1006 of the anode 1004 having a thickness T2 is arranged inside the peripheral portion 1007 with the thickness P2 so that the distance of the peripheral portion 1007 of the anode is a distance S3 closer to the extractor 1002 than the central portion 1006 of the anode 1005. The distance S3 can be in the range between 1.0 mm and 5.0 mm, more preferable in the range between 2.0 mm and 3.0 mm, even more preferable in the range between 2.5 mm and 2.7 mm.

In operation, the anode 1004 is biased with a positive electrical acceleration potential U2 relative to the cathode 1001 which is even more positive than the extraction potential U1. The anode potential can be in the range between 2 kV and 300 kV positive relative to cathode 1001, more preferable in the range between 20 kV and 100 kV, even more preferable in the range between 25 kV and 30 kV positive relative to cathode 1001.

Following in the direction of charged particles emitted along the optical axis M a first magnetic condenser lens 1008 having a rotational symmetric upper pole piece 1009 and a rotational symmetric lower pole piece 1010 is arranged. The upper pole piece 1009 is arranged at a distance S4 from anode 1004 measured from the central portion 1006 of anode 1004. The distance S4 between the upper pole piece 1009 and the anode 1004 can be in the range between 5 mm and 20 mm, more preferable in the range between 8 mm and 15 mm, even more preferable in the range between 12 mm and 13 mm. The upper pole piece 1009 of the first condenser lens 1008 has a thickness T3 at a terminating portion 1011 close to the optical axis M and measured in the direction of the optical axis M and the thickness T3 can be in the range between 0.5 mm and 5 mm, more preferable in the range between 1 mm and 3.5 mm, even more preferable in the range between 2 mm and 3 mm. The upper pole piece 1009 of the first condenser lens 1008 has a larger thickness P3 at a region 1012 peripheral from the optical axis M. The thickness P3 can be in the range between 2 mm and 8 mm, more preferable in the range between 3 mm and 6 mm, even more preferable in the range between 4 mm and 5 mm. The reduction of the thickness of the upper pole piece from peripheral region 1012 to the terminating portion 1011 can be continuously and can extend over a distance in a direction radially to the optical axis in the range between 10 mm and 20 mm, more preferable in the range between 12 mm and 17 mm, even more preferable in the range between 14 mm and 15 mm.

The lower pole piece 1010 of the first condenser lens 1008 is arranged at a distance S5 from the upper pole piece 1009. The distance S5 between the upper pole piece 1009 and the lower pole piece 1010 can be in the range between 5 mm and 15 mm, more preferable in the range between 7 mm and 10 mm, even more preferable in the range between 7.5 mm and 8 mm. The lower pole piece 1010 of the first condenser lens 1008 has a thickness T4 measured in the direction of the optical axis M and the thickness T4 can be in the range between 15 mm and 40 mm, more preferable in the range between 23 mm and 32 mm, even more preferable in the range between 26 mm and 28 mm.

The first condenser lens 1008 has a central pole piece boring 1013 aligned with the optical axis M and running through the upper pole piece 1009 and the lower pole piece 1010 and having a diameter D3. The diameter of the pole piece boring 1013 can be in the range between 30 mm and 70 mm, more preferable in the range between 40 mm and 60 mm, even more preferable in the range between 45 mm and 50 mm.

In operation, the first condenser lens 1008 can be excited with an electrical current to generate a magnetic flux B1. The magnetic flux B1 of the first condenser lens can be in the range between 500 and 2000 Ampere-turns, more preferable in the range between 700 Ampere-turns and 1500 Ampere-turns, even more preferable in the range between 1000 Ampere-turns and 1100 Ampere-turns.

Following in the direction of charged particles emitted along the optical axis M a second magnetic condenser lens 1015 having a rotational symmetric upper pole piece 1016 and a rotational symmetric lower pole piece 1017 is arranged downstream of the first condenser lens 1008 at a distance S6. The distance S6 between the lower pole piece 1010 of the first condenser lens 1008 and the upper pole piece 1016 of the second condenser lens 1015 can be in the range between 0.5 mm and 5 mm, more preferable in the range between 0.7 mm and 3 mm, even more preferable in the range between 1 mm and 2 mm.

The second condenser lens 1015 can have an identical or similar design as the first condenser lens 1008.

In operation, the second condenser lens 1015 can be excited with an electrical current to generate a magnetic flux B2. The magnetic flux B2 of the second condenser lens 1015 can be in the range between 100 and 1000 Ampere-turns, more preferable in the range between 200 Ampere-turns and 700 Ampere-turns, even more preferable in the range between 350 Ampere-turns and 500 Ampere-turns.

Following in the direction of charged particles emitted along the optical axis M a micro optics device 1020 (see FIGS. 9B and 9G) for forming the plurality of charged particle beamlets from the incoming charged particle beam is arranged at a distance S7 downstream of the lower pole piece 1017 of the second condenser lens 1015. The distance S7 between the lower pole piece 1017 of the second condenser lens 1015 and the micro optics device 1020 can be in the range between 20 mm and 40 mm, more preferable in the range between 25 mm and 35 mm, even more preferable in the range between 29 mm and 33 mm.

Figure 9G:
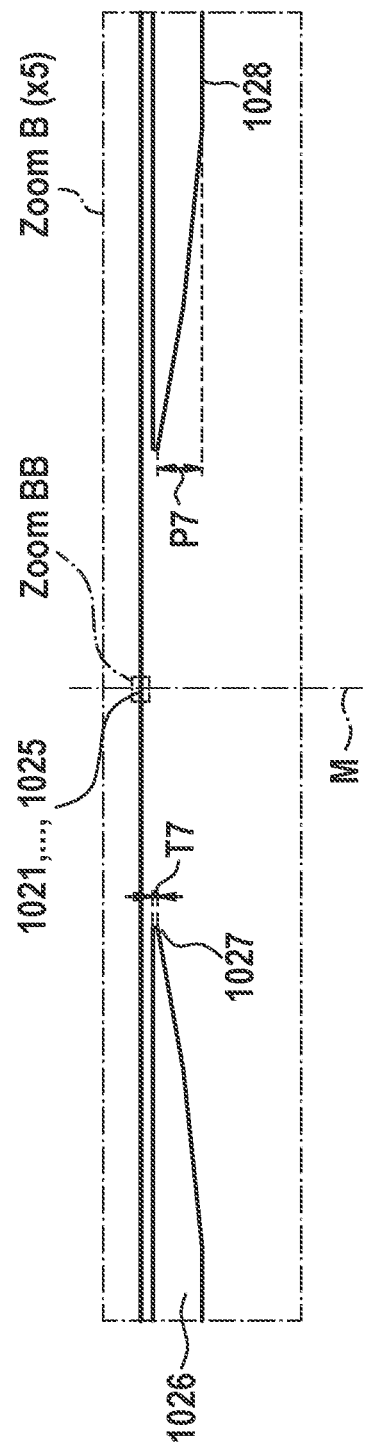
Figure 9H:
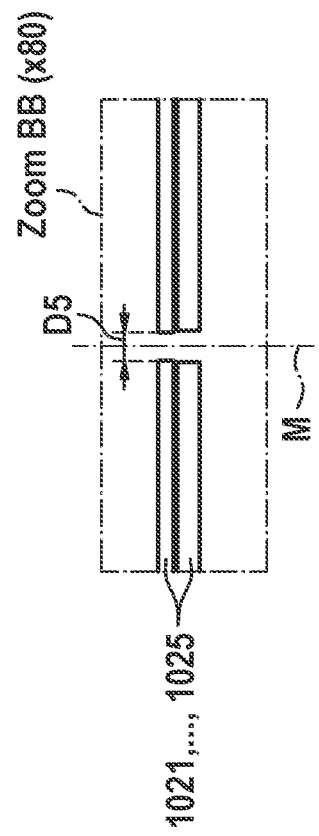

The micro-optics device includes a plurality of plates 1021-1025 as shown in FIG. 9G) in more detail, each plate including a plurality of holes corresponding to the number of beamlets to be formed from the incoming charged particle beams. For simplification, in FIG. 9G) only a single central hole is shown. The holes in the various plates are in communication one to another so that a charged particle beamlet passing a hole in one of the plates 1021-1025 also passes a hole in all of the other plates 1021-1025. Some of the plates 1021-1025 can include electrodes surrounding each of the hole for forming electrostatic dipole, quadrupole or higher multipole elements acting on an individual beamlet passing such hole. By applying appropriate potentials to the plates or the electrodes each of the individual beamlets can be manipulated individually. Alternatively or in addition all beamlets also can be manipulated globally in common by applying an identical electrical bias voltage or an identical off-set voltage to all electrodes of one plate.

The plate 1021 closest to the second condenser lens 1015 serves to form the beamlets and the holes in this plate have opening diameters which are smaller than the opening diameters D5 in the consecutive plates 1022-1025. The opening diameters D5 can be in the range between 0.01 mm and 0.15 mm, more preferable in the range between 0.04 mm and 0.08 mm, even more preferable in the range between 0.06 mm and 0.075 mm. The opening diameters of the beamlets forming plate 1021 should be in the range 30% to 80%, more preferable in the range 40% to 70%, even more preferable in the range 45% to 65% or 45% to 50% of the opening diameters D5.

Each of the plates 1021-1025 typically has a thickness measured in the direction of the optical axis in the range of 0.01 to 0.1 mm, more preferable in the range 0.02 to 0.07 mm, even more preferable in the range 0.03 to 0.05 mm.

Following in the direction of charged particles emitted along the optical axis M a holder device is arranged. The holder device 1026 has a thickness T7 at a terminating portion 1027 closest to the optical axis M and measured in the direction of the optical axis M and the thickness T7 can be in the range between 0.05 mm and 0.5 mm, more preferable in the range between 0.1 mm and 0.3 mm, even more preferable in the range between 0.15 mm and 0.2 mm. To increase the mechanical stability the holder 1026 can have a larger thickness P7 in a region 1028 peripheral from the optical axis M. The thickness P7 can be in the range between 1 mm and 5 mm, more preferable in the range between 1.5 mm and 3 mm, even more preferable in the range between 1.8 mm and 2.5 mm. The reduction of the thickness of the holder device 1026 from peripheral region 1028 to the terminating portion 1027 can be continuously and can extend over distance in a direction radially to the optical axis in the range between 5 mm and 30 mm, more preferable in the range between 8 mm and 20 mm, even more preferable in the range between 11 mm and 15 mm.

Following in the direction of charged particles emitted along the optical axis M following the micro optics device 1020 for forming the plurality of charged particle beamlets a focusing electrode 1030 is arranged at a distance S8 downstream of the micro optics device 1020. The distance S8 between the focusing electrode 1030 and the micro optics device 1020 can be in the range between 2 mm and 30 mm, more preferable in the range between 3 mm and 15 mm, even more preferable in the range between 6 mm and 7 mm, or in the range 3 mm to 7 mm.

The focusing electrode 1030 has a central opening 1031 having an opening diameter D7 aligned with the optical axis M. The diameter D7 of the opening 1031 of the focusing electrode 1030 can be in the range between 10 mm and 30 mm, more preferable in the range between 15 mm and 20 mm, even more preferable in the range between 16 mm and 18 mm.

The focusing electrode 1030 can have, as shown in FIG. 9B, a shielding tube portion which extends into the direction of the optical axis M and surrounds the optical axis with an inner tube diameter which is larger than the opening diameter D7 of the opening 1031 of the focusing electrode. Due to the shielding tube electrostatic stray fields from other components cannot affect the charged particle beamlets.

Following in the direction of charged particles emitted along the optical axis M following the focusing electrode 1030 a ring electrode 1035 is arranged at a distance S9 downstream of the focusing electrode 1030. The distance S9 between the focusing electrode 1030 and ring electrode 1035 can be in the range between 10 mm and 50 mm, more preferable in the range between 15 mm and 30 mm, even more preferable in the range between 20 mm and 25 mm. The ring electrode 1035 has a central opening which can be twice as large as the opening diameter 1031 of the focusing electrode 1030.

The ring electrode can have an upper extension that, in the direction of the optical axis M, partly overlaps the shielding tube portion of the focusing electrode 1030. In the direction of the optical axis M the ring electrode 1035 has a length extension that covers the space between the pole pieces 1041 and 1042 of a field lens 1040 (which will be described in more detail hereinafter) to more than 50%. At its termination portion in the direction of beam propagation, i.e. at its side directed away from the micro-optics device 1020, the ring electrode can provide a small aperture opening having an opening diameter that is smaller than the opening diameter D7 of the focusing electrode 1030, preferably even smaller than one half of the opening diameter D7 of the focusing electrode.

In operation, the micro optics device 1020 as well as the ring electrode 1035 can be at the same electrical potential as the anode 1004. The focusing electrode 1030, in operation, can be at an electrical potential U3 that is different from the electrical potential U2 of the anode and the micro optics device 1020 so that the micro optics device 1020 together with the focusing electrode 1030 and the ring electrode 1035 form an electrostatic Einzel-lens. To achieve this, the electrical potential U3 can be in the range 20%-100% more positive or less positive than the electrical potential U2, more preferable the electrical potential U3 is in the range 30% to 80% more positive or less positive than the electrical potential U2, even more preferable the electrical potential U3 is in the range 50% to 60% more positive or less positive than the electrical potential U2. Especially, the electrical potential U3 can be in the range 20%-100% more positive than the electrical potential U2, more preferable the electrical potential U3 can be in the range 30% to 80% more positive than the electrical potential U2, even more preferable the electrical potential U3 can be in the range 50% to 60% more positive than the electrical potential U2.

Following in the direction of charged particles emitted along the optical axis M a first magnetic field lens 1040 having a rotational symmetric upper pole piece 1041 and a rotational symmetric lower pole piece 1042 is arranged. The upper pole piece 1041 is arranged and formed so that its pole piece boring 1045 is arranged, measured at the optical axis M, at a distance S10 from the ring electrode. The distance S10 between the upper pole piece 1043 and (the upper edge of) the ring electrode 1035 can be in the range between 1 mm and 50 mm, more preferable in the range between 5 mm and 30 mm, even more preferable in the range between 10 mm and 15 mm. The upper pole piece 1041 of the first field lens 1040 has a thickness T9 at a terminating portion 1044 close to the optical axis M and measured in the direction of the optical axis M and the thickness T9 can be in the range between 1 mm and 20 mm, more preferable in the range between 3 mm and 10 mm, even more preferable in the range between 4 mm and 6 mm. The upper pole piece 1041 of the first field lens 1040 has a pole piece boring 1045 aligned with the optical axis M and having an opening diameter D9. The diameter of the pole piece boring 1045 can be in the range between 40 mm and 160 mm, more preferable in the range between 65 mm and 110 mm, even more preferable in the range between 75 mm and 85 mm.

The lower pole piece 1042 of the first field lens 1040 is arranged at a distance S11 from the upper pole piece 1041. The distance S11 between the upper pole piece 1041 and the lower pole piece 1042 can be in the range between 10 mm and 60 mm, more preferable in the range between 20 mm and 40 mm, even more preferable in the range between 28 mm and 32 mm. The lower pole piece 1042 of the first field lens 1040 has a thickness T10 measured in the direction of the optical axis M and the thickness T10 can be in the range between 2 mm and 10 mm, more preferable in the range between 3 mm and 8 mm, even more preferable in the range between 4.5 mm and 5.5 mm.

The lower pole piece 1042 of first field lens 1040 has a central pole piece boring 1046 aligned with the optical axis M and running through the lower pole piece 1042 and having a diameter D10. The diameter D10 of the pole piece boring 1046 can be in the range between 40 mm and 160 mm, more preferable in the range between 65 mm and 110 mm, even more preferable in the range between 75 mm and 85 mm.

In operation, the first field lens 1040 can be excited with an electrical current to generate a magnetic flux B3. The magnetic flux B3 of the first field lens 1040 can be in the range between −300 and −2000 Ampere-turns, more preferable in the range between −600 Ampere-turns and −1100 Ampere-turns, even more preferable in the range between −800 Ampere-turns and −900 Ampere-turns.

As can be seen in FIG. 9B, the ring electrode 1035 extends through the pole piece boring 1045 of the upper pole piece 1041 and extends through the major portion of the pole piece gap between the upper pole piece 1041 and the lower pole piece 1042 of the first condenser lens 1040.

Following in the direction of charged particles emitted along the optical axis M a second magnetic field lens 1050 having a rotational symmetric upper pole piece 1051 and a rotational symmetric lower pole piece 1052 is arranged. The upper pole piece 1051 is arranged and formed so that its pole piece boring 1055 is arranged, measured at the optical axis M, at a distance S12 from the lower pole piece 1042 of the first field lens. The distance S12 between the upper pole piece 1051 of the second field lens 1050 and the lower pole piece 1042 of the first field lens 1040 can be in the range between 50 mm and 300 mm, more preferable in the range between 100 mm and 200 mm, even more preferable in the range between 150 mm and 170 mm. The upper pole piece 1051 of the second field lens 1050 has a thickness T11 at a terminating portion 1054 close to the optical axis M and measured in the direction of the optical axis M and the thickness T11 can be in the range between 2 mm and 20 mm, more preferable in the range between 4 mm and 10 mm, even more preferable in the range between 5 mm and 8 mm. The upper pole piece 1051 of the second field lens 1050 has a pole piece boring 1055 aligned with the optical axis M and having an opening diameter D11. The diameter of the pole piece boring 1055 can be in the range between 40 mm and 160 mm, more preferable in the range between 65 mm and 110 mm, even more preferable in the range between 75 mm and 85 mm.

The lower pole piece 1052 of the second field lens 1050 is arranged at a distance S13 from the upper pole piece 1051. The distance S13 between the upper pole piece 1051 and the lower pole piece 1052 can be in the range between 10 mm and 80 mm, more preferable in the range between 20 mm and 50 mm, even more preferable in the range between 30 mm and 40 mm. The lower pole piece 1052 of the second field lens 1050 has a thickness T12 measured in the direction of the optical axis M and the thickness T12 can be in the range between 2 mm and 10 mm, more preferable in the range between 3 mm and 8 mm, even more preferable in the range between 4.5 mm and 5.5 mm.

The lower pole piece 1052 of second field lens 1050 has a central pole piece boring 1056 aligned with the optical axis M and running through the lower pole piece 1052 and having a diameter D12. The diameter D12 of the pole piece boring 1056 can be in the range between 40 mm and 160 mm, more preferable in the range between 65 mm and 110 mm, even more preferable in the range between 75 mm and 85 mm.

In operation, the second field lens 1050 can be excited with an electrical current to generate a magnetic flux B4. The magnetic flux B4 of the second field lens 105 can be in the range between 200 and −200 Ampere-turns, more preferable in the range between 50 Ampere-turns and −100 Ampere-turns, even more preferable in the range between −15 Ampere-turns and −35 Ampere-turns. It can be useful, in operation, to apply a current to the second field lens 1050 to compensate for a Larmor rotation caused by the first field lens 1040 and/or a third field lens 1060 and/or the objective lens 1080 following downstream of the second field lens.

Following in the direction of charged particles emitted along the optical axis M a third magnetic field lens 1060 having a rotational symmetric upper pole piece 1061 and a rotational symmetric lower pole piece 1062 is arranged. The upper pole piece 1061 is arranged and formed so that its pole piece boring 1065 is arranged, measured at the optical axis M, at a distance S14 from the lower pole piece 1052 of the second field lens. The distance S14 between the upper pole piece 1061 of the third field lens 1060 and the lower pole piece 1052 of the second field lens 1050 can be in the range between 10 mm and 80 mm, more preferable in the range between 20 mm and 50 mm, even more preferable in the range between 30 mm and 40 mm. The upper pole piece 1061 of the third field lens 1060 has a thickness T13 at a terminating portion 1064 close to the optical axis M and measured in the direction of the optical axis M and the thickness T13 can be in the range between 2 mm and 20 mm, more preferable in the range between 4 mm and 10 mm, even more preferable in the range between 5 mm and 8 mm. The upper pole piece 1061 of the third field lens 1060 has a pole piece boring 1065 aligned with the optical axis M and having an opening diameter D13. The diameter D13 of the pole piece boring 1065 can be in the range between 40 mm and 160 mm, more preferable in the range between 65 mm and 110 mm, even more preferable in the range between 75 mm and 85 mm.

The lower pole piece 1062 of the third field lens 1060 is arranged at a distance S15 from the upper pole piece 1061. The distance S15 between the upper pole piece 1061 and the lower pole piece 1062 can be in the range between 10 mm and 80 mm, more preferable in the range between 20 mm and 50 mm, even more preferable in the range between 30 mm and 40 mm. The lower pole piece 1062 of the third field lens 1060 has a thickness T14 measured in the direction of the optical axis M and the thickness T14 can be in the range between 2 mm and 10 mm, more preferable in the range between 3 mm and 8 mm, even more preferable in the range between 4.5 mm and 5.5 mm.

The lower pole piece 1062 of the third field lens 1060 has a central pole piece boring 1066 aligned with the optical axis M and running through the lower pole piece 1052 and having a diameter D14. The diameter D14 of the pole piece boring 1066 can be in the range between 40 mm and 160 mm, more preferable in the range between 65 mm and 110 mm, even more preferable in the range between 75 mm and 85 mm.

In operation, the third field lens 1060 can be excited with an electrical current to generate a magnetic flux B5. The magnetic flux B5 of the third field lens 1060 can be in the range between 100 and 1000 Ampere-turns, more preferable in the range between 300 Ampere-turns and 500 Ampere-turns, even more preferable in the range between 370 Ampere-turns and 420 Ampere-turns.

Further field lenses can be provided of similar design as the first, second and third field lenses 1040, 1050, 1060 downstream of the third field lens 1060. This will shift the distances along the direction of propagation of the charged particles within the charged particle beam system accordingly.

Following downstream of the third field lens 1060 a magnetic beam splitter is arranged with which the primary beam path leading from cathode 1001 to the object plane 1100 and the secondary beam path of interaction products caused to leave the object plane 1100 due to the impinging beamlets and leading from the object plane to a multi detector are separated one from another. The beam splitter is not described here in detail but already has been disclosed in WO 2005024881A2 which is hereby included by reference with respect to the design of the beam splitter.

In FIG. 9D, for simulation purposes, the beam splitter is shown substituted by a magnetic lens 1070 providing about the same action onto the primary beamlets as the beamsplitter itself. The action of the beamsplitter on the primary charged particle beamlets can partly (i.e. the real beam splitter mainly provides a different rotation of the charged particle beamlets around the optical axis than the substitution lens) be simulated by a magnetic rotational symmetric lens having an upper pole piece 1071 and a lower pole piece 1072, whereby the upper pole piece is arranged at a distance S16 from the lower pole piece 1062 of the third condenser lens. The distance S16 between the upper pole piece 1071 of the substitution lens for the beam splitter and the lower pole piece 1062 of the third field lens 1060 can be in the range between 100 mm and 200 mm, more preferable in the range between 120 mm and 170 mm, even more preferable in the range between 130 mm and 150 mm.

The upper pole piece 1071 of the substitution lens 1070 has a thickness T15 at a terminating portion 1074 close to the optical axis M and measured in the direction of the optical axis M and the thickness T15 can be in the range between 2 mm and 20 mm, more preferable in the range between 4 mm and 10 mm, even more preferable in the range between 5 mm and 8 mm. The upper pole piece 1071 of the substitution lens 1070 has a pole piece boring 1075 aligned with the optical axis M and having an opening diameter D15. The diameter D15 of the pole piece boring 1075 can be in the range between 3 mm and 20 mm, more preferable in the range between 6 mm and 13 mm, even more preferable in the range between 9 mm and 11 mm.

The lower pole piece 1072 of the substitution lens 1070 is arranged at a distance S17 from the upper pole piece 1071. The distance S17 between the upper pole piece 1071 and the lower pole piece 1072 can be in the range between 10 mm and 100 mm, more preferable in the range between 30 mm and 55 mm, even more preferable in the range between 35 mm and 45 mm. The lower pole piece 1072 of the substitution lens 1070 has a thickness T16 measured in the direction of the optical axis M and the thickness T16 can be in the range between 2 mm and 10 mm, more preferable in the range between 3 mm and 8 mm, even more preferable in the range between 4.5 mm and 5.5 mm.

The lower pole piece 1072 of the substitution lens 1070 has a central pole piece boring 1076 aligned with the optical axis M and running through the lower pole piece 1072 and having a diameter D16. The diameter D16 of the pole piece boring 1076 can be in the range between 3 mm and 20 mm, more preferable in the range between 6 mm and 13 mm, even more preferable in the range between 9 mm and 11 mm.

In operation, the substitution lens 1070 can be excited with an electrical current to generate a magnetic flux B6. The magnetic flux B6 of the substitution lens 1070 can be in the range between 100 and 1000 Ampere-turns, more preferable in the range between 200 Ampere-turns and 500 Ampere-turns, even more preferable in the range between 250 Ampere-turns and 300 Ampere-turns.

Following in the direction of charged particles emitted along the optical axis M downstream of the beamsplitter a combined magnetic-electrostatic objective lens 1080 having a rotational symmetric upper pole piece 1081 and a rotational symmetric lower pole piece 1082 is arranged. The upper pole piece 1081 is arranged and formed so that its pole piece boring 1083 is arranged, measured at the optical axis M, at a distance S18 from the lower pole piece 1062 of the third field lens. The distance S18 between the upper pole piece 1081 of the objective lens 1080 and the lower pole piece 1062 of the third field lens 1060 can be in the range between 200 mm and 500 mm, more preferable in the range between 300 mm and 380 mm, even more preferable in the range between 325 mm and 340 mm.

The upper pole piece 1081 of the objective lens 1080 in a region close to the optical axis M has a terminating first face portion 1083 running parallel to the optical axis M and a second face portion 1084 running inclined to the optical axis at an inclination angle of 30-45° so that the material thickness of the upper pole piece 1081 increases with increasing distance from the optical axis M. The upper pole piece 1081 has a thickness T17 at the terminating face portion 1083 close to the optical axis M and measured in the direction of the optical axis M and the thickness T17 can be in the range between 2 mm and 8 mm, more preferable in the range between 3 mm and 5 mm, even more preferable in the range between 3.8 mm and 4.2 mm. The upper pole piece 1081 of the objective lens 1080 has a pole piece boring 1085 aligned with the optical axis M and having an opening diameter D17. The diameter D17 of the pole piece boring 1085 can be in the range between 5 mm and 80 mm, more preferable in the range between 15 mm and 30 mm, even more preferable in the range between 20 mm and 24 mm.

The lower pole piece 1082 of the objective lens 1080 is arranged at a distance S19 from the upper pole piece 1081. The distance S19 between the upper pole piece 1081 and the lower pole piece 1082 in the region close to the optical axis M can be in the range between 10 mm and 40 mm, more preferable in the range between 18 mm and 30 mm, even more preferable in the range between 22 mm and 26 mm. The lower pole piece 1082 of the objective lens 1080 has a thickness T18 measured in the direction of the optical axis M at its terminating portion 1086 close to the optical axis M, and the thickness T18 can be in the range between 0.5 mm and 5 mm, more preferable in the range between 0.9 mm and 1.5 mm, even more preferable in the range between 1.1 mm and 1.3 mm. Also the thickness of the lower pole piece 1082 of the objective lens increases with increasing distance from the optical axis.

The lower pole piece 1082 of the objective lens 1080 has a central pole piece boring 1087 aligned with the optical axis M and running through the lower pole piece 1082 and having a diameter D18. The diameter D18 of the pole piece boring 1087 is smaller than the diameter D17 of the pole piece boring 1085 in the upper pole piece 1081 of the objective lens and can be in the range between 4 mm and 20 mm, more preferable in the range between 8 mm and 10 mm, even more preferable in the range between 9 mm and 9.4 mm.

The upper pole piece 1081 and the lower pole piece 1082 are electrically insulated relative to one another so that different electrical potentials can be applied to the upper pole piece 1081 relative to the lower pole piece 1082 of the objective lens.

Within the pole piece boring 1085 of the upper pole piece 1081 an electrical tube electrode 1088 is arranged. The electrical tube electrode 1088 is made of a non-magnetic but electrically conductive material. The inner diameter of the opening through the tube electrode 1088 is almost identical with the diameter of the pole piece boring 1087 of the lower pole piece 1082. The outer diameter of the tube electrode 1088 is identical with the diameter of the pole piece boring 1085 of the upper pole piece 1081 to provide electrical contact between the tube electrode 1088 and the upper pole piece 1081 of the objective lens. The tube electrode has a distance to the object plane 1100 measured in the direction of the optical axis M in the range between 6 mm and 15 mm, more preferable in the range between 7 mm and 10 mm, even more preferable in the range between 8 and 9 mm.

In operation, the objective lens 1080 can be excited with an electrical current to generate a magnetic flux B7. The magnetic flux B7 of the objective lens 1080 can be in the range between 500 and 3000 Ampere-turns, more preferable in the range between 1000 Ampere-turns and 2000 Ampere-turns, even more preferable in the range between 1300 Ampere-turns and 1500 Ampere-turns.

In operation, the electrical tube electrode 1088 is biased with the same electrical potential as the ring electrode 1035 so that the charged particles drift through the space between the ring electrode 1035 and the electrical tube electrode 1088 with a constant kinetic energy. Further, in operation, the lower pole piece 1082 of the objective lens can be biased with an electrical potential U4 that differs from the electrical potential of the electrical tube electrode 1088 and can be in the range between the potential of the electrical tube electrode 1088 and the electrical potential of the cathode 1001. More preferable, the electrical potential U4 of the lower pole piece 1082 of the objective lens is 1000 V to 10000 V more positive than the electrical potential of an object to be positioned in the object plane 1100, even more preferable, the electrical potential U4 of the lower pole piece 1082 of the objective lens is 2000 V to 5000V, for example 3000 V, more positive than the electrical potential of the object to be positioned in the object plane 1100.

With the above arrangement of the various components a charged particle multi beam system can be achieved having an overall system length S20 between the cathode 1001 and the object plane 1100 in which foci of the beamlets with minimal diameters can be achieved. The overall system length S20 can be in a range between 500 mm and 1500 mm, more preferable in a range between 700 mm and 1100 mm, and even more preferable in a range between 800 mm and 900 mm.

In the object plane 1100 a sample stage (not shown) is arranged onto which a sample can be positioned for investigation with the multi-beamlet charged particle system. The sample stage can be biased with a variable electrical potential U5. The electrical potential U5 can be varied between −10V and 25 kV relative to the electrical potential of the cathode 1001, more preferable between 0V and 3 kV relative to the electrical potential of the cathode 1001, even more preferable between 0V and 2 kV relative to the electrical potential of the cathode 1001.

The electric potentials U1 to U5, to the extent not otherwise described above, are defined relative to the cathode 1001.

The first and second condenser lenses as well as the first field lens interact with each other and, therefore, can be treated as a combined subsystem. In a similar manner, the second and third field lenses are coupled and also can be treated as a combined subsystem, whereas the objective lens should be treated as a separate subsystems. It is assumed that there are no residual magnetic stray fields from the other subsystem.

The extractor voltage can be adjusted to ensure optimal performance of the charged particle beam emitter.

The electric potential biased to the lower pole piece of the objective lens can be made dependent on the electric potential biased to the sample stage and, accordingly to a sample positioned on the sample stage. The biased potentials can be selected according to the desired application.

The excitations of the condenser lens system can be adjusted such that the illumination at the micro-optics device is telecentric and that the illumination area at the micro-optics device is optimal. The five remaining degrees of freedom, which are the electric potential of the focus electrode, the magnetic excitations of the three field lenses and of the objective lens can be carefully adjusted such that the system is focused at the sample, i.e. the foci of the individual beamlets are minimal in the object plane 1100, a desired magnification is achieved, rotation of the image is optimal, and the illumination in the object plane 1100 is telecentric.

In certain embodiments it is useful to adjust an overall image rotation from the micro-optic device 1020 to the object plane to a different value than 0°, for example to 60° or an integer multiple of 60° if the holes in the micro-optic device 1020 are arranged in a hexagonal pattern, or 90° or an integer multiple of 90°, if the holes in the micro-optic device 1020 are arranged in a rectangular pattern.

A dispersion of the magnetic beam splitter can combine with geometrical or energy dependent aberrations of the lenses arranged upstream of the beamsplitter. Because the resulting combined aberrations are difficult to correct downstream of the beamsplitter, the beamsplitter advantageously is configured to be dispersion free for a single pass of the primary charged particle beamlets. Accordingly the magnetic beamsplitter is advantageously configured of two, three or more consecutive magnetic deflection fields at least two of which provide deflections in opposite directions onto the particle beamlets passing there through. A dispersion-free beamsplitter means that there exists at least one real or imaginary entrance plane (dispersion-free entrance plane of the beamsplitter) which is imaged by the beam splitter achromatically, with other words free of dispersion, into a real or imaginary exit plane (dispersion-free exit plane of the beamsplitter). In the dispersion free exit plane the positions of the trajectories of the charged particles show no, or only little, dependence on the energy of the individual charged particle. With a dispersion-free beamsplitter the objective lens 1080 can be adjusted so that its real or imaginary object plane coincides with the dispersion-free exit plane of the beamsplitter. An adjustment of the image in which the charged particle beamlets are optimal focused can be achieved by varying the bias potential of the focusing electrode 1030.

FIG. 10 shows a cross-section of a design of an alternative combined electrostatic-magnetic objective lens which can be used in combination with all other components of the multi beam charged particle beam system described above, especially in combination with an embodiment as described with reference to FIG. 9A to 9H, downstream of the beam splitter.

The objective lens 1180 in FIG. 10 includes a rotational symmetric upper pole piece 1181 and a rotational symmetric lower pole piece 1082. The upper pole piece 1181 is arranged and formed so that its pole piece boring 1083 is arranged, measured at the optical axis M, closer to the beam splitter than the lower pole piece 1182. The upper pole piece 1181 of the objective lens 1180 in a region close to the optical axis M has a terminating first face portion 1184 running parallel to the optical axis M and a second face portion 1085 running inclined to the optical axis at an inclination angle of 30-45° so that the material thickness of the upper pole piece 1181 decreases with increasing distance from the optical axis M. The upper pole piece 1181 of the objective lens 1180 has a pole piece boring 1183 aligned with the optical axis M.

The lower pole piece 1182 of the objective lens 1080 is arranged below but very close to the upper pole piece 1181, and in a direction parallel to the optical axis partially overlaps the upper pole piece 1181. The thickness of the lower pole piece 1182 of the objective lens increases with increasing distance from the optical axis.

The lower pole piece 1182 of the objective lens 1180 has a central pole piece boring 1187 aligned with the optical axis M and running through the lower pole piece 1182. Measured along the optical axis, a projection P2 of an upper edge of the lower pole piece 1182 at its pole piece boring 1187 is at the same distance from the cathode as, or closer to the cathode than a projection P1 of a lower edge 1188 of the upper pole piece 1181 at its pole piece boring 1183. This means that the magnetic portion of the objective lens 1180 is a so called radial gap lens.

The upper pole piece 1181 and the lower pole piece 1182 are electrically insulated relative to one another so that different electrical potentials can be applied to the upper pole piece 1181 relative to the lower pole piece 1182 of the objective lens.

Within the pole piece boring 1183 of the upper pole piece 1181 an electrical tube electrode 1190 is arranged. The electrical tube electrode 1190 is made of a non-magnetic but electrically conductive material. The electrical tube electrode 1190 terminates at the same height as the lower end of the pole piece boring 1183 of the upper pole piece 1181.

Within the pole piece boring 1187 of the lower pole piece 1182 a circular plate electrode 1191 is arranged. The circular plate electrode 1191 has a boring 1192 aligned with the optical axis M and positioned at a distance from the cathode which is larger than the distance of the projection P2 of the upper edge of the lower pole piece 1182 at its pole piece boring 1187 and, at the same time, is also larger than the distance of the projection P1 of the lower edge 1188 of the upper pole piece 1181 at its pole piece boring 1183 from the cathode. The inner diameter of the opening through the tube electrode 1190 is smaller than the diameter of the boring 1192 of the circular plate electrode 1191. The circular plate electrode 1191 also is made of a non-magnetic but electrically conductive material.

In operation, the objective lens 1180 can be excited with an electrical current to generate a magnetic flux B8.

In operation, the electrical tube electrode 1190 is biased with the same electrical potential as the ring electrode 1035 so that the charged particles drift through the space between the ring electrode 1035 and the electrical tube electrode 1190 with a constant kinetic energy. Further, in operation, the lower pole piece 1182 of the objective lens and the circular plate electrode 1191 can be biased with an electrical potential U6 that differs from the electrical potential of the electrical tube electrode 1190 and can be in the range between the potential of the electrical tube electrode 1190 and the electrical potential U1 of the cathode 1001.

The multi beam charged particle projection system shown in FIG. 11 is similar to the projection system described above with reference to FIG. 2 and includes, in addition to the objective lens 1201 and the beam splitter 1203 which also form part of the multi beam illumination system, a first charged particle lens 1205, a second charged particle lens 1207 and a third charged particle lens 1209. The objective lens 1201 has a back-focal plane 1202 positioned between the objective lens 1201 and the entrance plane of the beam splitter 1203. In this back-focal plane 1202 a crossover of the secondary electrons emitted from a sample 1200 due to the impinging primary beamlets is formed which means that in the back-focal plane 1202 all secondary beamlets formed by the objective lens 1201 cross the optical axis. Due to the refractive power of the objective lens 1201 and the beam splitter 1203 an intermediate image of the surface of the sample is formed in a plane 1204 within the beam splitter.

The first charged particle lens 1205 is configured and excited to image the back-focal plane of the objective lens into a second crossover plane in the immediate vicinity of the second charged particle lens 1207. In this second crossover plane a diaphragm 1206 is arranged to eliminate secondary electrons with large transvers momentum and which are likely to cause undesired crosstalk between the secondary beamlets by hitting a wrong detection region in the plane of the multi detector 1211. The diaphragm 1206 can be configured in a similar manner as the diaphragm 216 or 1213 described above with reference to FIGS. 2, 6 and 7.

The second charged particle lens 1207 close to or in the second crossover plane is arranged and mainly configured to focus the secondary electron beamlets onto the plane of the multi detector 1211. The third charged particle lens 1209 following downstream of the second charged particle lens 1207 in the propagation direction of the secondary electron beamlets mainly serves to adjust the magnification of the projection beam path and, accordingly the pitch or distances between the secondary electron beamlets in the plane of the multi detector 1211.

In another operation mode for alignment of the projection system, the second and third charged particle lenses 1207 and 1209 can be configured and excited to image the second crossover plane sufficiently magnified onto the plane of the multi detector 1211 to check the alignment of the diaphragm 1206 with respect to the crossover position in a direction perpendicular to the optical axis. In this mode of operation, the second and third magnetic lenses form a group of magnetic charged particle lenses configured to image the crossover of the multiple secondary charged particle beamlets onto the detector system, and, in another mode of operation, to image an intermediate image of the impingement locations onto the detector system. The magnification of the imaging of the crossover plane onto the detector is chosen in a manner that the diameter of the crossover image covers several detection regions of the multi detector. Usually, the crossover is positioned in the center of the diaphragm. However, by decentering the crossover, topographical contrasts, charging contrasts and/or voltage contrasts can be enhanced for the operation mode in which the impingement locations are imaged onto the multi-detector 1211. Additionally, when all primary beamlets except one are blanked in the operation mode in which the crossover plane is imaged sufficiently magnified onto the plane of the multi detector 1211, the angular distribution of secondary electrons in this one beamlet can be determined by analyzing the signals from the different detection regions of the multi detector 1211. This allows to obtain information on topography, material or charging of the object at the location at which the unblanked primary beamlet impinges on the sample 1200.

When at least one of the optical components in the projection system are magnetic, the rotation of the secondary electron beamlets around the optical axis of the projection system can be compensated by rotating the multi detector 1211. Alternatively, the rotation can be adjusted with an additional magnetic charged particle lens.

The projection system in FIG. 11 further includes a first antiscan-system 1222 configured and excited to compensate any movement of the secondary charged particle beamlets in the plane of the multi detector 1211 caused by the scanning of the primary charged particle beamlets. A second antiscan-system 1223 can be configured and excited to compensate any movement of the secondary charged particle beamlets, caused by the scanning of the primary charged particle beamlets, in the plane of the second crossover where the diaphragm 1206 is placed. The first and/or second antiscan-system 1222, 1223 can be positioned between the charged particle lens 1205 and the second crossover plane 1206. Alternatively, the first anti-scan system 1222 can be positioned between the charged particle lens 1209 and the multi detector 1211.

Due to the action of the beam splitter 1203 downstream of the intermediate image plane 1204 (in the direction of propagation of the secondary electrons beamlets) in combination with the actions of the first charged particle lens 1205 and the second charged particle lens 1207 a second intermediate image of the impingement locations of the primary charged particle beamlets on the sample can be formed between the second charged particle lens 1207 and the third charged particle lens 1209. In addition, due to the action of the second charged particle lens 1207 and the third charged particle lens 1209 a further crossover plane 1210 can be formed downstream between the third charged particle lens and the multi detector 1211. If desired, a further diaphragm to eliminate secondary electrons likely to cause crosstalk can be arranged in this further crossover plane 1210 as described above with reference to FIG. 8. The position of this second crossover plane 1210 along the optical axis will vary when the multi beam charged particle system is used under different conditions, e.g., when the sample stage bias U5 is changed. An additional charged particle lens (not shown in FIG. 11) can be provided in the projection system according to FIG. 11 and configured and excited to keep the position of the second crossover plane 1210 fixed.

For the alignment of the projection system in FIG. 11, a magnetic multipole 1224 and one or more electrostatic multipoles 1225 can be positioned close to the back-focal plane 1202 of the objective lens. Multipoles with at least eight pole elements can be used to allow alignment with respect to the optical axis and to correct two-fold astigmatism. Multipoles with twelve pole elements would enable correction of three-fold astigmatism and/or three-fold distortion caused by the beamsplitter. The electrodes of the electrostatic multipoles can be used to simultaneously scan the primary particle beamlets.

Further multipole alignment elements 1226 can be placed between the first lens 1205 and the second lens 1207, e.g., magnetic eight- or twelve-pole elements for correcting deflection, two-fold astigmatism and distortion and three-fold astigmatism and distortion. Additionally, an x-y-deflector 1227 can be placed between the last projection lens 1209 and the multi detector 1211.

As described with reference to FIG. 4, the multi detector 1211 can be configured in the form of a scintillator plate with an additional optical beam path to image light emitted from different regions of the scintillator plate onto different light detectors.

The multi beam charged particle projection system shown in FIG. 12 is similar to the projection system described above with reference to FIG. 8 and provides a three step magnification. The projection system includes, in addition to the objective lens 1301 and the beam splitter 1303 which also form part of the multi beam illumination system, a first charged particle lens 1305, a second charged particle lens 1306 and a third charged particle lens 1307, a fourth charged particle lens 1309, a fifth charged particle lens 1310, a sixth charged particle lens 1311, a seventh charged particle lens 1312, an eighth charged particle lens 1313 and a ninth charged particle lens 1314. The objective lens 1301, again, has a back-focal plane 1302 positioned between the objective lens 1301 and the entrance plane of the beam splitter 1303. In this back-focal plane 1302 a crossover of the secondary electrons emitted from a sample 1300 due to the impinging primary beamlets is formed which means that in the back-focal plane 1302 all secondary beamlets formed by the objective lens 1301 cross the optical axis. Due to the refractive power of the beam splitter 1303 and the objective lens 1301 an intermediate image of the surface of the sample is formed in a plane 1304 close to the center of the beam splitter. Up to this end, the projection system in FIG. 12 is identical to the projection system described above with reference to FIG. 11.

The first charged particle lens 1305 is configured and excited to image the back-focal plane of the objective lens into a second crossover plane in the immediate vicinity of the third charged particle lens 1307. In this second crossover plane a diaphragm 1308 is arranged to eliminate secondary electrons with large transverse momentum and which are likely to cause undesired crosstalk between the secondary beamlets by hitting a wrong detection region in the plane of the multi detector 1315. The diaphragm 1308, again, can be configured in a similar manner as the diaphragms described above with reference to FIGS. 2, 6 and 7.

The second charged particle lens 1306 arranged between the first charged particle lens 1305 and the third charged particle lens 1307 is configured as an electrostatic immersion lens providing a deceleration of the kinetic energy of the secondary electrons in the secondary electron beamlets. This has the advantage that a beam liner tube in the system downstream of the second charged particle lens can be set on a potential close to ground potential.

The fourth charged particle lens 1309 is positioned close to a plane in which a second intermediate image plane is formed. The fifth charged particle lens 1310 is positioned close to a plane into which the second crossover plane is imaged due to the action of the fourth charged particle lens 1309. Due to the combined actions of the third charged particle lens 1307, the fourth charged particle lens 1309 and the fifth charged particle lens 1310 the rotation of the secondary electron beamlets around the optical axis of the projection system as well as the magnification of the imaging of the sample plane 1300 onto the multi detector 1315 and the position of the (third) crossover close to the fifth charged particle lens 1310 can be adjusted independently of another.

The sixth charged particle lens 1311 and the seventh charged particle lens 1312 generate a fourth crossover plane. The sixth charged particle lens 1311 is positioned in front of an intermediate image plane generated due to the action of the fifth charged particle lens 1310 and the seventh charged particle lens 1312 is positioned immediately downstream of this intermediate image plane. The sixth charged particle lens 1311 and the seventh charged particle lens 1312 form a magnetic twin lens with inverse directions of magnetic field and serve to adjust or correct an azimuthal and a radial distortion of the secondary charged particle beamlets.

The eighth charged particle lens 1313 is positioned close to the fourth crossover plane and images the intermediate image plane between the sixth charged particle lens 1311 and the seventh charged particle lens 1312 onto the multi detector 1315. The ninth charged particle lens 1314 is positioned and excited to have its front focal plane coinciding with the fourth crossover plane. Due to this configuration it can be achieved that the secondary electron beamlets run parallel with respect to one another and with respect to the optical axis of the projection system when impinging onto the multi detector 1315. In other words, a telecentric landing of the secondary electron beamlets onto the multi detector 1315 can be achieved.

The ninth charged particle lens 1314 can be configured as a decelerating electrostatic immersion lens to adjust the energy of the electrons before impinging onto the multi detector.

Additionally, an energy filter 1320 can be positioned between the ninth charged particle lens 1314 and the multi detector. The energy filter consists of multiple micro-aperture-array (MAA) chips mounted in a stack with separate electrical connection to each chip. This allows the usage as an electrostatic high-pass energy filter for each individual secondary electron beamlet. With the addition of the energy filter voltage contrast signals can be enhanced. A respective energy filter is described in more detail in U.S. Pat. No. 9,336,981, the disclosure of which is herein incorporated by reference. With the ninth charged particle lens 1314 the telecentricity of the secondary electron beamlets when impinging onto the energy filter 1320 can be adjusted.

With the above described configuration round lens distortions, rotation orientation of the secondary beamlets, the magnification of the imaging of the secondary charged particle beamlets onto the multi detector 1315, the telecentricity of the secondary electron beamlets, the energy of the secondary beamlets, the potential of the beam liner tube downstream of the second charged particle lens 1306, and the position of the second crossover and the third crossover close to charged particle lens 1310 can be adjusted independently of one another.

For the alignment of the projection system in FIG. 12 electrostatic or magnetic x-y-deflectors 1325 can be positioned near the lenses 1305, 1310 and 1311. Additionally one or more multipole stigmators 1321 can be positioned anywhere in the projection system, especially between the charged particle lenses 1305 and 1306 and/or close to charged particle lenses 1307 and 1311. A first and/or second antiscan-system 1322, 1323 can also be positioned between the charged particle lenses 1310 and 1311.

Again, as described with reference to FIG. 4, the multi detector 1315 can be configured in the form of a scintillator plate with an additional optical beam path to image light emitted from different regions of the scintillator plate onto different light detectors.

In the embodiments of a multi detector having a scintillator plate and a downstream optical imaging system to image light emitted due to the secondary electron beamlets impinging onto the scintillator plate independently and locally separated on the multiple light detectors, light emitted by the scintillator plate into a backward direction (i.e. into a direction opposite to the direction of propagation of the secondary electron beamlets) and falling onto components of the projection system or onto the vacuum chamber walls can cause an undesired signal background. To avoid or reduce such background signal, photon baffles can be provided close to the scintillator plate on the secondary electron entrance side of the scintillator plate. In addition, electrons backscattered at the scintillator plate and re-impinging onto the scintillator plate after having been scattered at components of the projection system or at the vacuum chamber walls also can cause undesired background signals. To avoid or reduce such background signal, electron baffles can be provided close to the scintillator plate on the secondary electron entrance side of the scintillator plate to prevent backscattered electrons from generating secondary electrons. Alternatively, or in addition, the scintillator plate can be biased slightly with a negative voltage of some ten Volts (about −20 to −100 Volts) relative to the vacuum chamber wall, or a Faraday-cup or an electrode slightly biased positively (about 20 to 100 Volts) relative to the scintillator plate can be provided on the secondary electron entrance side of the scintillator plate.

What is claimed is:

1. A multi-beamlet charged particle system, comprising:
   a multi-beam illumination system, comprising:
      a charged particle source configured to generate a first charged particle beam;
      a micro-optics device configured to generate a plurality of primary charged particle beamlets from the first charged particle beam, each individual primary charged particle beamlet being spatially separated from other primary charged particle beamlets;
      a focusing electrode following the micro-optics device;
      a ring electrode following the focusing electrode;
      an electrical tube electrode;
      a first magnetic field lens between the ring electrode and the electrical tube electrode;
      a magnetic beam splitter between the ring electrode and the electrical tube electrode; and
      an objective lens configured to define a first crossover of secondary electron beamlets between the objective lens and the magnetic beamsplitter, the secondary electron beamlets generated via interaction of the primary charged particle beamlets with a sample in a sample plane;
   a detector system comprising first and second individual detectors;
   a projection system configured to image secondary electrons of the secondary electron beamlets, the projection lens comprising:
      a first charged particle lens configured to image a back focal plane of the objective lens into a second crossover plane; and
      second, third and fourth charged particle lenses configured to independently adjust a magnification of an image of the sample plane onto the detector and a position of a third crossover,
wherein the multi-beamlet charged particle system is configured so that, during use of the multi-beamlet charged particle system, the electrical tube electrode and the ring electrode are biased with the same electrical potential so that charged particles of the primary charged particle beamlets drift through a space between the ring electrode and the tube electrode with a constant kinetic energy.

2. The multi-beamlet charged particle system of claim 1, wherein the objective lens further comprises an upper pole piece comprising an upper pole piece boring, and the electrical tube electrode is in the upper pole piece boring.

3. The multi-beamlet charged particle system of claim 2, wherein:
the objective lens further comprises a lower pole piece comprising a lower pole piece boring;
the upper pole piece boring is closer to the charged particle source than is the lower pole piece boring; and
an opening diameter of the upper pole piece boring is larger than a diameter of a lower pole piece boring.

4. The multi-beamlet charged particle system of claim 3, wherein an inner diameter of an opening through the tube electrode is identical to the diameter of the lower pole piece boring.

5. The multi-beamlet charged particle system of claim 1, wherein the multi-beam illumination system further comprises an electrostatic multipole in a vicinity of the first crossover.

6. The multi-beamlet charged particle system of claim 1, wherein the projection system further comprises a fifth charged particle lens configured to rotate the secondary electron beamlets around an optical axis of the projection system.

7. The multi-beamlet charged particle system of claim 1, wherein:
the magnetic beam splitter comprises a first magnetic field region, a second magnetic field region; and a drift region between the first and the second magnetic field regions; and
the magnetic beam splitter is configured so that, during use of the multi-beamlet charged particle system, the magnetic beam splitter is free of dispersion for a single pass of the first charged particle beamlets passing the beam splitter from the first magnetic field lens to the objective lens.

8. The multi-beamlet charged particle system of claim 1, wherein the objective lens and the magnetic beam splitter are configured to form an intermediate image of a surface of the sample close to a center of the magnetic beam splitter.

9. The multi-beamlet charged particle system of claim 1, wherein the projection system further comprises a decelerating electrostatic immersion lens configured to adjust the energy of the electrons before impinging onto the detector system.

10. The multi-beamlet charged particle system of claim 1, wherein the projection system comprises a further charged particle lens configured to have its front focal plane coincident with the second crossover plane.

11. The multi-beamlet charged particle system of claim 1, wherein the projection system further comprises an energy filter comprising a plurality of multiple micro-aperture-array (MAA) chips mounted in a stack with separate electrical connections to each chip.

12. The multi-beamlet charged particle system of claim 1, wherein the detector system comprises photon and/or electron baffles on a secondary electron entrance side to prevent backscattered photons or backscattered electrons from generating secondary electrons.

13. The multi-beamlet charged particle system of claim 12, wherein the detector system comprises a scintillator plate and the photon and/or electron baffles are provided at a secondary electron entrance side of the scintillator plate.

14. The multi-beamlet charged particle system of claim 1, wherein:
the charged particle beam source comprises a cathode, an extractor electrode and an anode; and
during use of the multi-beamlet charged particle system:
the extractor electrode is biased with a positive electrical extraction potential U1 relative to the cathode;
the anode is biased with a positive electrical acceleration potential U2 relative to the cathode;
U2>U1; and
U1 is between 2 kV and 10 kV positive relative to cathode.

15. The multi-beamlet charged particle system of claim 14, wherein, during use of the multi-beamlet charged particle system, U2 is between 2 kV and 300 kV positive relative to cathode.

16. The multi-beamlet charged particle system of claim 14, wherein:
the anode has a central portion close to an optical axis;
the central portion of the anode has a central opening having an opening diameter D2 and a thickness T2;
the central portion has a peripheral portion with in a region peripheral from the optical axis to increase mechanical stability of the anode;
the peripheral portion has a thickness P2; and
P2>T2.

17. The multi-beamlet charged particle system of claim 16, wherein D2 is between 0.1 mm and 2.0 mm, T2 is between 0.1 mm and 0.5 mm, and P2 is between 5 mm and 10 mm.

18. The multi-beamlet charged particle system of claim 14, wherein the system is configured so that, during use of the multi-beamlet charged particle system, the micro-optics device and the ring electrode are at the electrical potential U2.

19. The multi-beamlet charged particle system of claim 14, wherein:
the focusing electrode is closer to the multi beam generator than is the ring electrode; and
during use of the charged particle beam system:
the multi beam generator and the ring electrode are biased with an identical electrical potential; and
the focusing electrode is biased with an electrical potential that differs from the electrical potential of the ring electrode.

20. The multi-beamlet charged particle system of claim 14, wherein, during use of the charged particle beam system, the focusing electrode is at an electrical potential U3 that is in the range 20%-100% more positive than the electrical potential U2.

21. The multi-beamlet charged particle system of claim 14, further comprising a sample stage configured to hold the sample in the sample plane, wherein the sample stage is biased with an electrical potential that is variable between −10V and 25 kV relative to the electrical potential of the cathode.

22. The multi-beamlet charged particle system of claim 14, wherein, during use of the charged particle beam system, the lower pole piece is biased with an electrical potential that is 1000 V to 10000 V more positive than the electrical potential of the sample.

23. The multi-beamlet charged particle system of claim 1, further comprising a sample stage configured to hold the sample in the sample plane.

* * * * *